(12) United States Patent
Hoya

(10) Patent No.: US 11,973,015 B2
(45) Date of Patent: Apr. 30, 2024

(54) PLURALITY OF OVERLAPPING POWER TERMINALS IN A SEMICONDUCTOR MODULE

(71) Applicant: FUJI ELECTRIC CO., LTD., Kawasaki (JP)

(72) Inventor: Masashi Hoya, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 208 days.

(21) Appl. No.: 17/349,125

(22) Filed: Jun. 16, 2021

(65) Prior Publication Data
US 2021/0407899 A1 Dec. 30, 2021

(30) Foreign Application Priority Data
Jun. 25, 2020 (JP) ................. 2020-109252

(51) Int. Cl.
| | |
|---|---|
| H01L 23/498 | (2006.01) |
| H01L 23/495 | (2006.01) |
| H01L 25/07 | (2006.01) |
| H01L 25/075 | (2006.01) |
| H01L 23/00 | (2006.01) |

(52) U.S. Cl.
CPC .. H01L 23/49844 (2013.01); H01L 23/49537 (2013.01); H01L 23/49541 (2013.01);
(Continued)

(58) Field of Classification Search
CPC ......... H01L 23/49844; H01L 23/49811; H01L 23/498894; H01L 23/48838;
(Continued)

(56) References Cited

U.S. PATENT DOCUMENTS

| | | |
|---|---|---|
| 5,471,089 A | 11/1995 | Nagatomo et al. |
| 5,751,058 A | 5/1998 | Matsuki |

(Continued)

FOREIGN PATENT DOCUMENTS

| | | |
|---|---|---|
| JP | H06-021323 A | 1/1994 |
| JP | H09-121019 A | 5/1997 |

(Continued)

OTHER PUBLICATIONS

Japan Patent Office, "Office Action for Japanese Patent Application No. 2020-109252," Mar. 5, 2024.

*Primary Examiner* — Alonzo Chambliss
(74) *Attorney, Agent, or Firm* — Manabu Kanesaka

(57) ABSTRACT

The present invention is directed to provide a semiconductor module capable of achieving miniaturization and reduced manufacturing cost while suppressing surge voltage generated when switching the semiconductor elements. A semiconductor module includes a negative terminal and a positive terminal. The negative terminal has a negative fastening portion for fastening a negative polarity-side external terminal, a negative connection portion connected to a laminated substrate, and a negative intermediate portion arranged between the negative fastening portion and the negative connection portion. The positive terminal has a positive fastening portion for fastening a positive polarity-side external terminal, positive connection portions connected to the laminated substrate, and a positive intermediate portion facing the negative intermediate portion with a predetermined gap and arranged between the positive fastening portion and the positive connection portions.

20 Claims, 12 Drawing Sheets

(52) U.S. Cl.
CPC .. *H01L 23/49548* (2013.01); *H01L 23/49575* (2013.01); *H01L 23/49811* (2013.01); *H01L 23/49838* (2013.01); *H01L 23/49861* (2013.01); *H01L 23/49894* (2013.01); *H01L 25/072* (2013.01); *H01L 25/0753* (2013.01); *H01L 24/46* (2013.01); *H01L 24/49* (2013.01)

(58) Field of Classification Search
CPC ............. H01L 23/49861; H01L 23/498; H01L 23/4952; H01L 23/49537; H01L 23/49575; H01L 23/49548; H01L 24/49; H01L 24/46; H01L 25/072; H01L 25/0753; H01L 23/49894
See application file for complete search history.

(56) References Cited

U.S. PATENT DOCUMENTS

| | | | |
|---|---|---|---|
| 6,525,950 B1* | 2/2003 | Shirakawa | ............ H02M 7/003 |
| | | | 307/148 |
| 10,326,378 B2* | 6/2019 | Doo | ................... H05K 7/14329 |
| 11,218,080 B2* | 1/2022 | Doo | ........................ H02G 5/005 |
| 2004/0113268 A1* | 6/2004 | Shirakawa | .............. H01L 25/18 |
| | | | 257/E23.173 |
| 2010/0148298 A1* | 6/2010 | Takano | ................... H01L 24/49 |
| | | | 257/500 |
| 2015/0171578 A1* | 6/2015 | Taylor | .................. H01R 25/161 |
| | | | 439/251 |
| 2017/0042053 A1 | 2/2017 | Soyano et al. | |
| 2020/0013752 A1 | 1/2020 | Nakamura | |
| 2021/0118613 A1 | 4/2021 | Reiter et al. | |

FOREIGN PATENT DOCUMENTS

| | | |
|---|---|---|
| JP | H10-022451 A | 1/1998 |
| JP | 2006-210500 A | 8/2006 |
| JP | 2007-096004 A | 4/2007 |
| JP | 2010177573 A2 * | 8/2010 |
| JP | 2017-037892 A | 2/2017 |
| JP | 2020-009834 A | 1/2020 |
| JP | 2020-053622 A | 4/2020 |
| JP | 2020-072106 A | 5/2020 |
| JP | 2020-080348 A | 5/2020 |
| WO | 2017/221730 A1 | 12/2017 |

* cited by examiner

PLURALITY OF OVERLAPPING POWER TERMINALS IN A SEMICONDUCTOR MODULE

RELATED APPLICATIONS

The present application is based on, and claims priority from, Japanese Application No. JP2020-109252 filed Jun. 25, 2020, the disclosure of which is hereby incorporated by reference herein in its entirety.

TECHNICAL FIELD

The present invention relates to a semiconductor module intended to be applied to a power conversion device or the like.

BACKGROUND ART

A variety of types of modules are used as power semiconductor devices for inverter devices or the like that convert DC power to AC power depending on applications and the like. A 2-in-1 type semiconductor module has a structure in which a half-bridge circuit formed by connecting in series unit arms each including a set of a semiconductor switching element and a rectifier element connected in parallel and connecting positive (P) and negative (N) terminals connected to DC power, and an AC phase (U) terminal connected to AC power is built into a single package.

A 4-in-1 type semiconductor module has a single-phase AC compatible structure in which a circuit made up of two parallel half-bridge circuits connected by positive (P) and negative (N) terminals is built into a single package. A 6-in-1 type semiconductor module has a three-phase AC compatible structure in which a circuit made up of three parallel half-bridge circuits connected by positive (P) and negative (N) terminals is built into a single package.

PTL 1 discloses a 2-in-1 type semiconductor module. In the technology described by PTL 1, an AC-phase (U) wiring bar connected to emitters of upper arm-side semiconductor elements above the upper arm-side semiconductor elements and extending along an array of the plurality of upper arm-side semiconductor elements and a negative (N) wiring bar connected to emitters of lower arm-side semiconductor elements above the lower arm-side semiconductor elements and extending along an array of the plurality of lower arm-side semiconductor elements are arranged to face, in parallel to, and in close proximity to each other. This reduces wiring inductance to suppress surge voltage generated when switching the semiconductor elements.

PTL 2 describes a power semiconductor device including bent main terminals each having projections on a lower surface of thereof.

CITATION LIST

Patent Literature

PTL 1: JP 2017-037892 A
PTL 2: WO 2017/221730

SUMMARY OF INVENTION

Technical Problem

In the structure in which the main circuit wiring bars are arranged to face, in parallel to, and in close proximity to each other above the upper arm-side semiconductor elements and the lower arm-side semiconductor elements in order to reduce wiring inductance, restrictions are likely to occur in terms of a gate wiring layout for each semiconductor element and positions of the semiconductor elements mounted on an insulating substrate. This makes it difficult to miniaturize the semiconductor module.

Additionally, such a structure requires a high-level assembly technology, which may increase manufacturing cost in terms of equipment, man-hours, and yield.

It is an object of the present invention to provide a semiconductor module capable of achieving miniaturization and reduced manufacturing cost while suppressing surge voltage generated when switching semiconductor elements.

Solution to Problem

To achieve the above object, a semiconductor module according to one aspect of the present invention includes a first power supply terminal connected to a first polarity side of DC power, a second power supply terminal connected to a second polarity side of the DC power, a plurality of semiconductor elements connected in series between the first power supply terminal and the second power supply terminal, and a substrate including the plurality of semiconductor elements, in which the first power supply terminal has a first fastening portion for fastening an external terminal of the first polarity side, a first connection portion connected to the substrate, and a first intermediate portion arranged between the first fastening portion and the first connection portion, and in which the second power supply terminal has a second fastening portion arranged adjacent to the first fastening portion and being for fastening an external terminal of the second polarity side, a pair of second connection portions arranged across the first connection portion and connected to the substrate, and a second intermediate portion at least apart of which faces the first intermediate portion with a predetermined gap and which is arranged between the second fastening portion and the pair of second connection portions.

Advantageous Effects of Invention

According to the one aspect of the present invention, miniaturization and reduced manufacturing cost can be achieved while suppressing surge voltage generated when switching the semiconductor elements.

DESCRIPTION OF EMBODIMENTS

Each embodiment of the present invention exemplifies devices and methods for embodying the technological idea of the present invention, and the technological idea of the present invention does not limit materials, shapes, structures, arrangement, and the like of the components to those described below. Various modifications can be added to the technological idea of the present invention without departing from the technological scope defined by the claims described in CLAIMS.

First Embodiment

A semiconductor module according to a first embodiment of the present invention will be described using FIGS. 1 to 10. First, a schematic configuration of the semiconductor module according to the present embodiment will be described using FIGS. 1 to 4. In the present embodiment, a power conversion module capable of converting DC to AC power will be described as an example of the semiconductor module.

Figure 1:
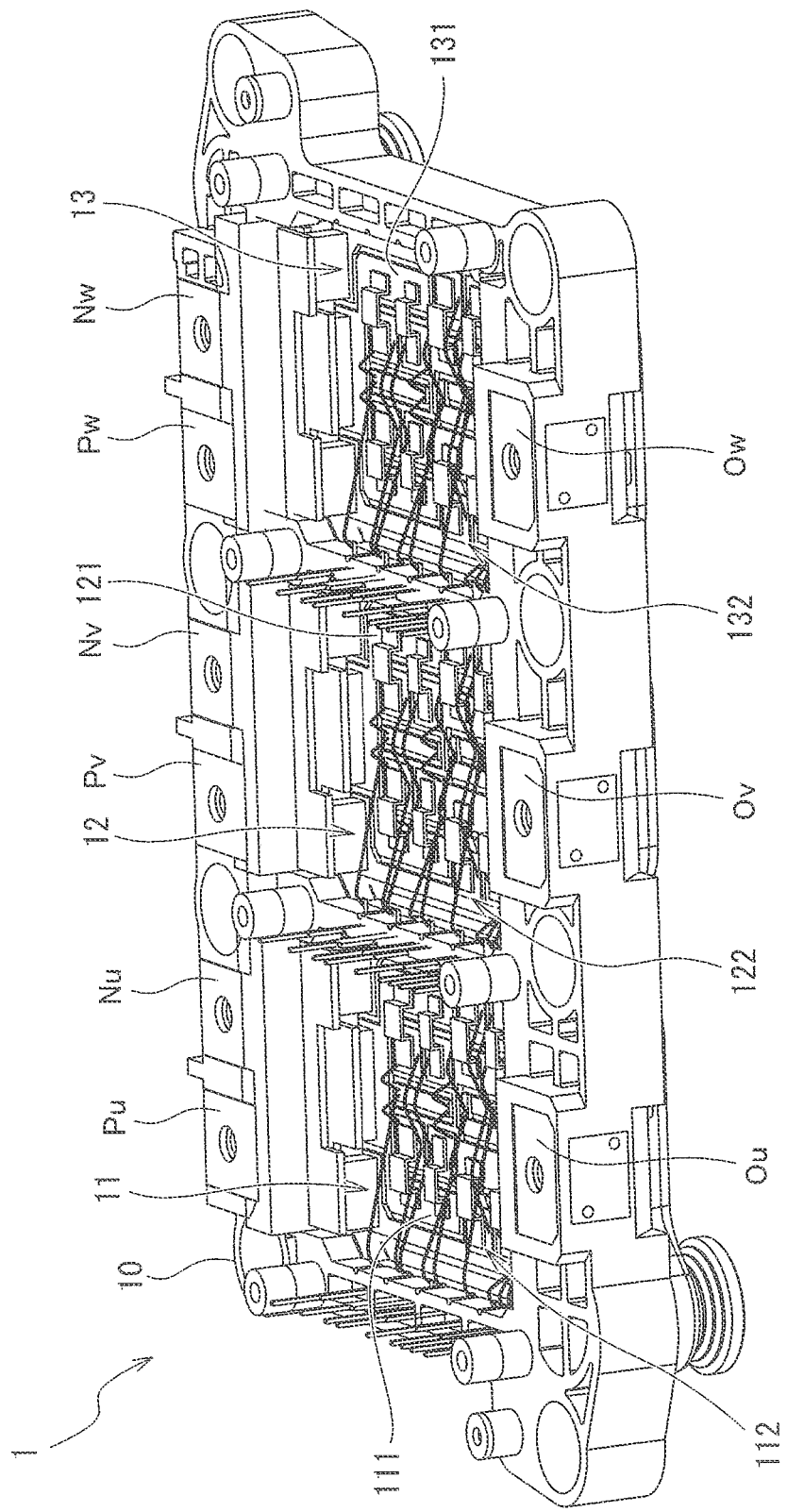
FIG. 1 is a diagram illustrating a schematic configuration of a main part of a semiconductor module according to a first embodiment of the present invention.

As illustrated in FIG. 1, a semiconductor module 1 according to the present embodiment includes a case 10 having a rectangular shape in planar view. The case 10 has a storage section 11 for storing a U-phase inverter portion, a storage section 12 for storing a V-phase inverter portion, and a storage section 13 for storing a W-phase inverter portion. The semiconductor module 1 has a U-phase laminated substrate 111 (an example of a substrate) stored in the storage section 11 and a U-phase inverter circuit 112 mounted on the laminated substrate 111. The semiconductor module 1 has a V-phase laminated substrate 121 (an example of the substrate) stored in the storage section 12 and a V-phase inverter circuit 122 mounted on the laminated substrate 121. The semiconductor module 1 has a W-phase laminated substrate 131 (an example of the substrate) stored in the storage section 13 and a W-phase inverter circuit 132 mounted on the laminated substrate 131.

The case 10 is arranged to surround a plurality of semiconductor elements (see details given later), the laminated substrates 111, 121, and 131, a plurality of wiring patterns (see details given later), and a plurality of connection members (see details given later) in the case 10. The case 10 is mounted on a heat dissipation base or cooler (neither illustrated), and is mechanically fixed to the heat dissipation base or cooler by a case bonding material (unillustrated). This allows the case 10 to dissipate heat generated from the semiconductor elements to an outside of the case 10.

The semiconductor module 1 includes a U-phase negative terminal Nu (an example of a first power supply terminal) connected to a negative polarity (an example of a first polarity) side of DC power and a positive terminal Pu (an example of a second power supply terminal) connected to a positive polarity (an example of a second polarity) side of the DC power. The negative terminal Nu and the positive terminal Pu are provided on one of both sides of the storage section 11, at one longitudinal end portion of the case 10. The semiconductor module 1 also includes an output terminal Ou for outputting U-phase AC power. The output terminal Ou is provided on the other one of both sides of the storage section 11, at the other longitudinal end portion of the case 10. The positive terminal Pu and the negative terminal Nu are arranged to face the output terminal Ou across the storage section 11.

The semiconductor module 1 includes a V-phase negative terminal Nv (an example of the first power supply terminal) connected to the negative polarity (an example of the first polarity) side of DC power and a positive terminal Pv (an example of the second power supply terminal) connected to the positive polarity (an example of the second polarity) side of the DC power. The negative terminal Nv and the positive terminal Pv are provided on one of both sides of the storage section 12, at one longitudinal end portion of the case 10. The semiconductor module 1 also includes an output terminal Ov for outputting V-phase AC power. The output terminal Ov is provided on the other one of both sides of the storage section 12, at the other longitudinal end portion of the case 10. The positive terminal Pv and the negative terminal Nv are arranged to face the output terminal Ov across the storage section 12.

The semiconductor module 1 includes a W-phase negative terminal Nw (an example of the first power supply terminal) connected to the negative polarity (an example of the first polarity) side of DC power and a positive terminal Pw (an example of the second power supply terminal) connected to the positive polarity (an example of the second polarity) side of the DC power. The negative terminal Nw and the positive terminal Pw are provided on one of both sides of the storage section 13, at one longitudinal end portion of the case 10. The semiconductor module 1 also includes an output terminal Ow for outputting W-phase AC power. The output terminal Ow is provided on the other one of both sides of the storage section 13, at the other longitudinal end portion of the case 10. The positive terminal Pw and the negative terminal Nw are arranged to face the output terminal Ow across the storage section 13.

Next, circuit structures of the inverter circuits 112, 122, and 132 included in the semiconductor module 1 will be described using FIGS. 2 to 4.

Figure 2:
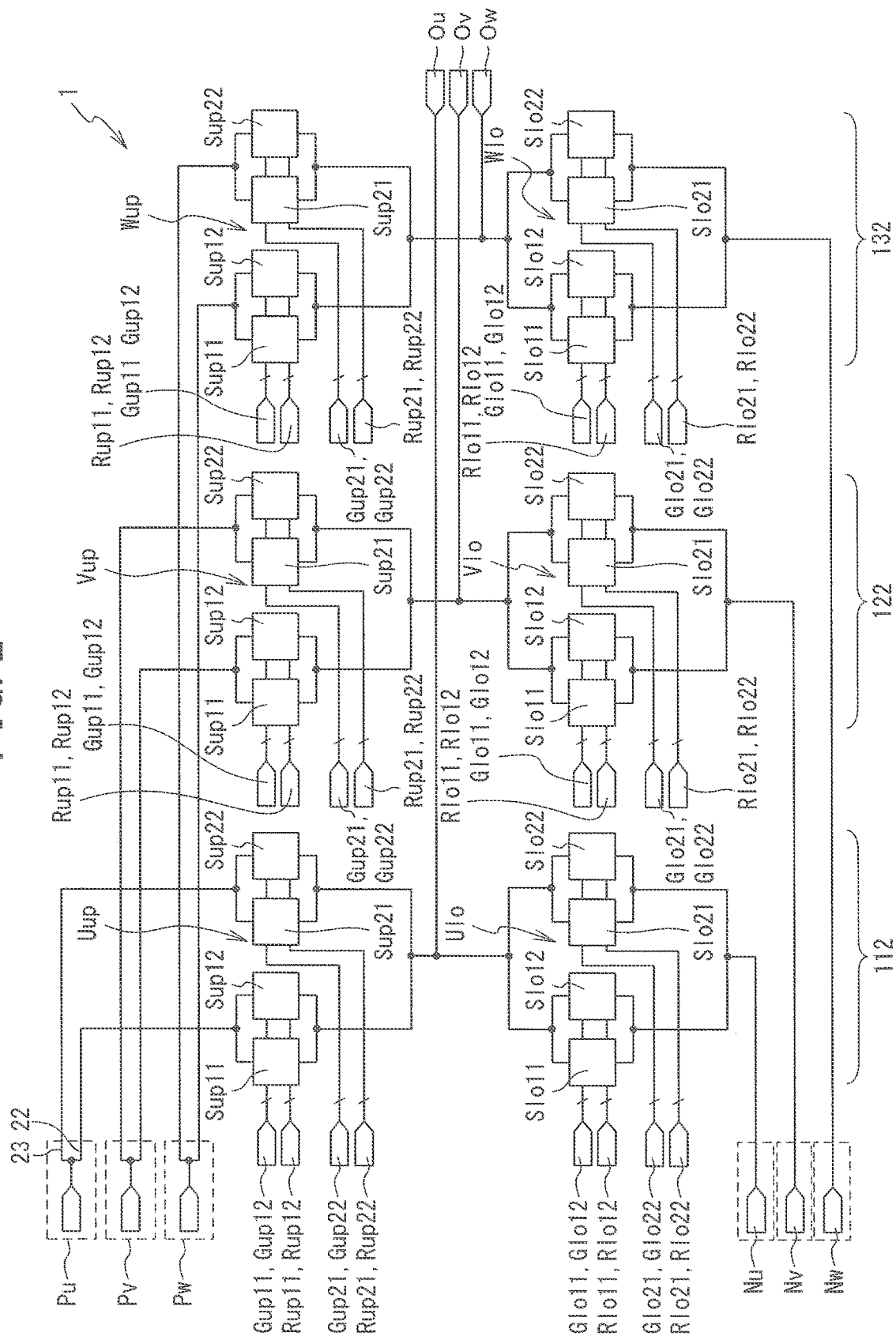
FIG. 2 is a circuit diagram of the semiconductor module according to the first embodiment of the present invention.

As illustrated in FIG. 2, the inverter circuit 112 provided in the semiconductor module 1 includes a plurality of semiconductor elements Sup11, Sup12, Sup21, and Sup22 and a plurality of semiconductor elements Slo11, Slo12, Slo21, and Slo22 connected in series between the negative terminal Nu and the positive terminal Pu. In the inverter circuit 112, the semiconductor elements Sup11, Sup12, Sup21, and Sup22 are connected in parallel, and the semiconductor elements Slo11, Slo12, Slo21, and Slo22 are connected in parallel. The semiconductor elements Sup11, Sup12, Sup21, and Sup22 connected in parallel and the semiconductor elements Slo11, Slo12, Slo21, and Slo22 connected in parallel are connected in series between the negative terminal Nu and the positive terminal Pu. In the inverter circuit 112, a connection portion between the semiconductor elements Sup11, Sup12, Sup21, and Sup22 connected in parallel and the semiconductor elements Slo11, Slo12, Slo21, and Slo22 connected in parallel is connected to the output terminal Ou for outputting U-phase AC power. In other words, in the inverter circuit 112, the semiconductor elements Sup11, Sup12, Sup21, and Sup22 form an upper arm Uup for U-phase AC power, and the semiconductor elements Slo11, Slo12, Slo21, and Slo22 form a lower arm Ulo for U-phase AC power.

As illustrated in FIG. 2, the inverter circuit 122 provided in the semiconductor module 1 includes a plurality of semiconductor elements Sup11, Sup12, Sup21, and Sup22 and a plurality of semiconductor elements Slo11, Slo12, Slo21, and Slo22 connected in series between the negative terminal Nv and the positive terminal Pv. In the inverter circuit 122, the semiconductor elements Sup11, Sup12, Sup21, and Sup22 are connected in parallel, and the semiconductor elements Slo11, Slo12, Slo21, and Slo22 are connected in parallel. The semiconductor elements Sup11, Sup12, Sup21, and Sup22 connected in parallel and the semiconductor elements Slo11, Slo12, Slo21, and Slo22 connected in parallel are connected in series between the negative terminal Nv and the positive terminal Pv. In the inverter circuit 122, a connection portion between the semiconductor elements Sup11, Sup12, Sup21, and Sup22 connected in parallel and the semiconductor elements Slo11, Slo12, Slo21, and Slo22 connected in parallel is connected to the output terminal Ov for outputting V-phase AC power. In other words, in the inverter circuit 122, the semiconductor elements Sup11, Sup12, Sup21, and Sup22 form an upper arm Vup for V-phase AC power, and the semiconductor elements Slo11, Slo12, Slo21, and Slo22 form a lower arm Vlo for V-phase AC power.

As illustrated in FIG. 2, the inverter circuit 132 provided in the semiconductor module 1 includes a plurality of semiconductor elements Sup11, Sup12, Sup21, and Sup22 and a plurality of semiconductor elements Slo11, Slo12, Slo21, and Slo22 connected in series between the negative terminal Nw and the positive terminal Pw. In the inverter circuit 132, the semiconductor elements Sup11, Sup12, Sup21, and Sup22 are connected in parallel, and the semiconductor elements Slo11, Slo12, Slo21, and Slo22 are connected in parallel. The semiconductor elements Sup11, Sup12, Sup21, and Sup22 connected in parallel and the semiconductor elements Slo11, Slo12, Slo21, and Slo22 connected in parallel are connected in series between the negative terminal Nw and the positive terminal Pw. In the inverter circuit 132, a connection portion between the semiconductor elements Sup11, Sup12, Sup21, and Sup22 connected in parallel and the semiconductor elements Slo11, Slo12, Slo21, and Slo22 connected in parallel is connected to the output terminal Ow for outputting W-phase AC power. In other words, in the inverter circuit 132, the semiconductor elements Sup11, Sup12, Sup21, and Sup22 form an upper arm Wup for W-phase AC power, and the semiconductor elements Slo11, Slo12, Slo21, and Slo22 form a lower arm Wlo for W-phase AC power.

The output terminals Ou, Ov, and Ow are connected to, for example, a motor, which is an object to be driven by the semiconductor module 1. This allows the semiconductor module 1 to supply U-phase AC power to the motor via the output terminal Ou of the inverter circuit 112, supply V-phase AC power thereto via the output terminal Ov of the inverter circuit 122, and supply W-phase AC power thereto via the output terminal Ow of the inverter circuit 132.

The semiconductor elements Sup11, Sup12, Sup21, Sup22, Slo11, Slo12, Slo21, and Slo22 included in each of the inverter circuits 112, 122, and 132 have the same configuration as each other. Thus, hereinafter, using FIG. 3, the semiconductor elements Sup11, Sup12, Sup21, Sup22, Slo11, Slo12, Slo21, and Slo22 included in the inverter circuit 112 will be exemplified to describe the semiconductor elements Sup11, Sup12, Sup21, Sup22, Slo11, Slo12, Slo21, and Slo22 included in each of the inverter circuits 112, 122, and 132.

Figure 3:
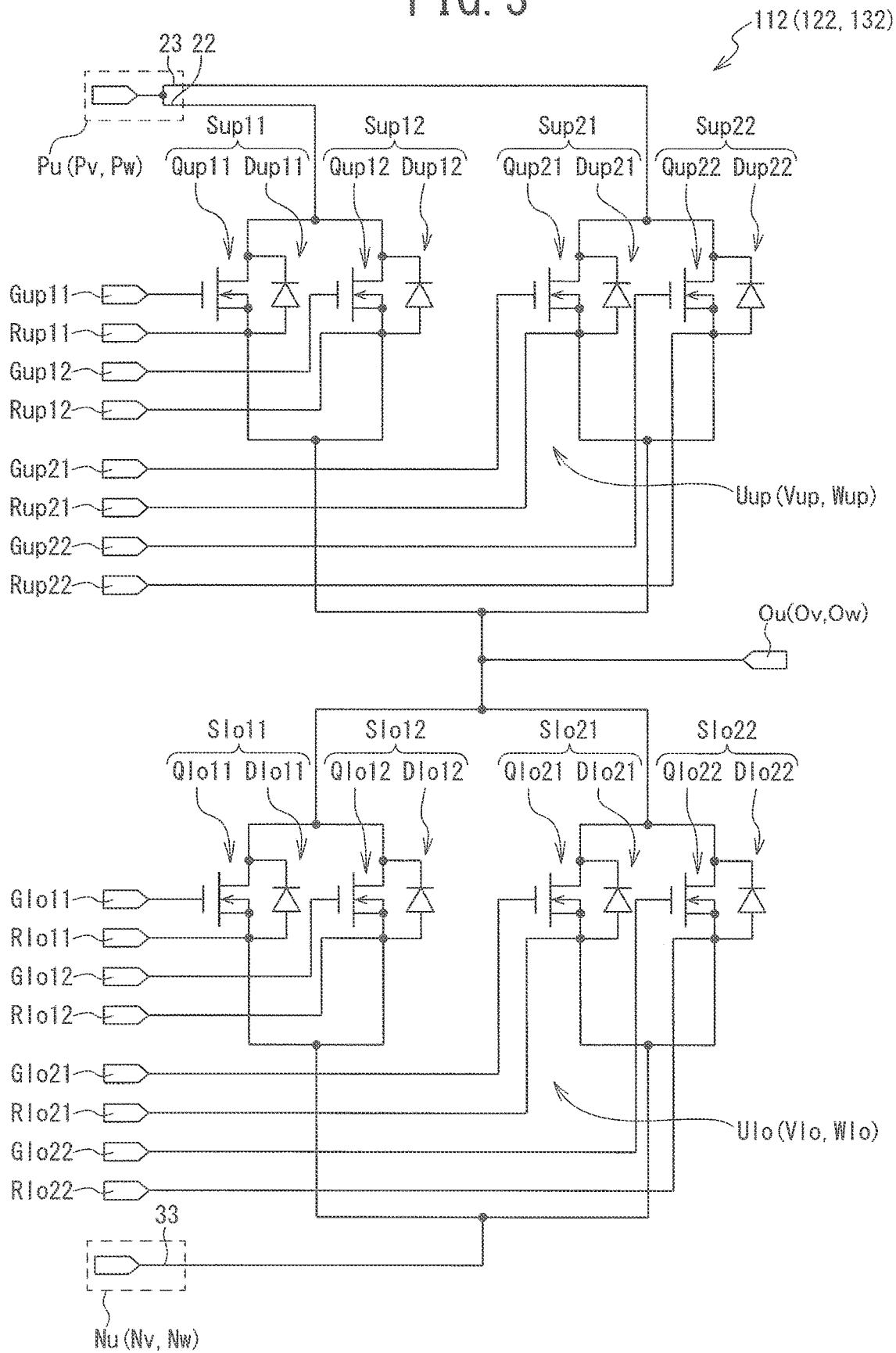
FIG. 3 is a circuit diagram of an inverter circuit included in the semiconductor module according to the first embodiment of the present invention.

As illustrated in FIG. 3, the semiconductor element Sup11 has a transistor Qup11, which is, for example, an N-type MOSFET, and a freewheeling diode Dup11 connected anti-parallel to the transistor Qup11. The transistor Qup11 and the freewheeling diode Dup11 are, for example, formed on a single semiconductor substrate and made into a single chip. The transistor Qup11 is formed by, for example, a wide-bandgap semiconductor element containing SiC, GaN, diamond, a gallium nitride-based material, a gallium oxide-based material, AlN, AlGaN, ZnO, or the like. A drain of the transistor Qup11 is connected to a cathode of the freewheeling diode Dup11, and a source of the transistor Qup11 is connected to an anode of the freewheeling diode Dup11.

The semiconductor element Sup12 has a transistor Qup12, which is, for example, an N-type MOSFET, and a freewheeling diode Dup12 connected anti-parallel to the transistor Qup12. The transistor Qup12 and the freewheeling diode Dup12 are, for example, formed on a single semiconductor substrate and made into a single chip. The transistor Qup12 is formed by, for example, a wide-bandgap semiconductor element containing SiC, GaN, diamond, a gallium nitride-based material, a gallium oxide-based material, AlN, AlGaN, ZnO, or the like. A drain of the transistor Qup12 is connected to a cathode of the freewheeling diode Dup12, and a source of the transistor Qup12 is connected to an anode of the freewheeling diode Dup12.

The drain of the transistor Qup11 and the cathode of the freewheeling diode Dup11 are connected to the drain of the transistor Qup12 and the cathode of the freewheeling diode Dup12. The drain of the transistor Qup11, the cathode of the freewheeling diode Dup11, the drain of the transistor Qup12, and the cathode of the freewheeling diode Dup12 are connected to a positive connection portion 22 (see details given later) provided in the positive terminal Pu.

The source of the transistor Qup11 and the anode of the freewheeling diode Dup11 are connected to the source of the transistor Qup12 and the anode of the freewheeling diode Dup12. The source of the transistor Qup11, the anode of the freewheeling diode Dup11, the source of the transistor Qup12, and the anode of the freewheeling diode Dup12 are connected to the output terminal Ou.

As illustrated in FIG. 3, the semiconductor element Sup21 has a transistor Qup21, which is, for example, an N-type MOSFET, and a freewheeling diode Dup21 connected anti-parallel to the transistor Qup21. The transistor Qup21 and the freewheeling diode Dup21 are, for example, formed on a single semiconductor substrate and made into a single chip. The transistor Qup21 is formed by, for example, a wide-bandgap semiconductor element containing SiC, GaN, diamond, a gallium nitride-based material, a gallium oxide-based material, AlN, AlGaN, ZnO, or the like. A drain of the transistor Qup21 is connected to a cathode of the freewheeling diode Dup21, and a source of the transistor Qup21 is connected to an anode of the freewheeling diode Dup21.

The semiconductor element Sup22 has a transistor Qup22, which is, for example, an N-type MOSFET, and a freewheeling diode Dup22 connected anti-parallel to the transistor Qup22. The transistor Qup22 and the freewheeling diode Dup22 are, for example, formed on a single semiconductor substrate and made into a single chip. The transistor Qup22 is formed by, for example, a wide-bandgap semiconductor element containing SiC, GaN, diamond, a gallium nitride-based material, a gallium oxide-based material, AlN, AlGaN, ZnO, or the like. A drain of the transistor Qup22 is connected to a cathode of the freewheeling diode Dup22, and a source of the transistor Qup22 is connected to an anode of the freewheeling diode Dup22.

The drain of the transistor Qup21 and the cathode of the freewheeling diode Dup21 are connected to the drain of the transistor Qup22 and the cathode of the freewheeling diode Dup22. The drain of the transistor Qup21, the cathode of the freewheeling diode Dup21, the drain of the transistor Qup22, and the cathode of the freewheeling diode Dup22 are connected to a positive connection portion 23 (see details given later) provided in the positive terminal Pu.

The source of the transistor Qup21 and the anode of the freewheeling diode Dup21 are connected to the source of the transistor Qup22 and the anode of the freewheeling diode Dup22. The source of the transistor Qup21, the anode of the freewheeling diode Dup21, the source of the transistor Qup22, and the anode of the freewheeling diode Dup22 are connected to the output terminal Ou.

As illustrated in FIG. 3, the semiconductor element Slo11 has a transistor Qlo11, which is, for example, an N-type MOSFET, and a freewheeling diode Dlo11 connected anti-parallel to the transistor Qlo11. The transistor Qlo11 and the freewheeling diode Dlo11 are, for example, formed on a single semiconductor substrate and made into a single chip. The transistor Qlo11 is formed by, for example, a wide-bandgap semiconductor element containing SiC, GaN, diamond, a gallium nitride-based material, a gallium oxide-based material, AlN, AlGaN, ZnO, or the like. A drain of the transistor Qlo11 is connected to a cathode of the freewheeling diode Dlo11, and a source of the transistor Qlo11 is connected to an anode of the freewheeling diode Dlo11.

The semiconductor element Slo12 has a transistor Qlo12, which is, for example, an N-type MOSFET, and a freewheeling diode Dlo12 connected anti-parallel to the transistor Qlo12. The transistor Qlo12 and the freewheeling diode Dlo12 are, for example, formed on a single semiconductor substrate and made into a single chip. The transistor Qlo12 is formed by, for example, a wide-bandgap semiconductor element containing SiC, GaN, diamond, a gallium nitride-based material, a gallium oxide-based material, AlN, AlGaN, ZnO, or the like. A drain of the transistor Qlo12 is connected to a cathode of the freewheeling diode Dlo12, and a source of the transistor Qlo12 is connected to an anode of the freewheeling diode Dlo12.

The source of the transistor Qlo11 and the anode of the freewheeling diode Dlo11 are connected to the source of the transistor Qlo12 and the anode of the freewheeling diode Dlo12. The source of the transistor Qlo11, the anode of the freewheeling diode Dlo11, the source of the transistor Qlo12, and the anode of the freewheeling diode Dlo12 are connected to a negative connection portion 33 (see details given later) provided in the negative terminal Nu.

The drain of the transistor Qlo11 and the cathode of the freewheeling diode Dlo11 are connected to the drain of the transistor Qlo12 and the cathode of the freewheeling diode Dlo12. The drain of the transistor Qlo11, the cathode of the freewheeling diode Dlo11, the drain of the transistor Qlo12, and the cathode of the freewheeling diode Dlo12 are connected to the output terminal Ou.

As illustrated in FIG. 3, the semiconductor element Slo21 has a transistor Qlo21, which is, for example, an N-type MOSFET, and a freewheeling diode Dlo21 connected anti-parallel to the transistor Qlo21. The transistor Qlo21 and the freewheeling diode Dlo21 are, for example, formed on a single semiconductor substrate and made into a single chip. The transistor Qlo21 is formed by, for example, a wide-bandgap semiconductor element containing SiC, GaN, diamond, a gallium nitride-based material, a gallium oxide-based material, AlN, AlGaN, ZnO, or the like. A drain of the transistor Qlo21 is connected to a cathode of the freewheeling diode Dlo21, and a source of the transistor Qlo21 is connected to an anode of the freewheeling diode Dlo21.

The semiconductor element Slo22 has a transistor Qlo22, which is, for example, an N-type MOSFET, and a freewheeling diode Dlo22 connected anti-parallel to the transistor Qlo22. The transistor Qlo22 and the freewheeling diode Dlo22 are, for example, formed on a single semiconductor substrate and made into a single chip. The transistor Qlo22 is formed by, for example, a wide-bandgap semiconductor element containing SiC, GaN, diamond, a gallium nitride-based material, a gallium oxide-based material, AlN, AlGaN, ZnO, or the like. A drain of the transistor Qlo22 is connected to a cathode of the freewheeling diode Dlo22, and a source of the transistor Qlo22 is connected to an anode of the freewheeling diode Dlo22.

The source of the transistor Qlo21 and the anode of the freewheeling diode Dlo21 are connected to the source of the transistor Qlo22 and the anode of the freewheeling diode Dlo22. The source of the transistor Qlo21, the anode of the freewheeling diode Dlo21, the source of the transistor Qlo22, and the anode of the freewheeling diode Dlo22 are connected to the negative connection portion 33 (see details given later) provided in the negative terminal Nu. Furthermore, the source of the transistor Qlo21, the anode of the freewheeling diode Dlo21, the source of the transistor Qlo22, and the anode of the freewheeling diode Dlo22 are connected to the source of the transistor Qlo11, the anode of the freewheeling diode Dlo11, the source of the transistor Qlo12, and the anode of the freewheeling diode Dlo12.

The drain of the transistor Qlo21 and the cathode of the freewheeling diode Dlo21 are connected to the drain of the transistor Qlo22 and the cathode of the freewheeling diode Dlo22. The drain of the transistor Qlo21, the cathode of the freewheeling diode Dlo21, the drain of the transistor Qlo22, and the cathode of the freewheeling diode Dlo22 are connected to the output terminal Ou.

The source of the transistor Qup11, the anode of the freewheeling diode Dup11, the source of the transistor Qup12, and the anode of the freewheeling diode Dup12, the source of the transistor Qup21, the anode of the freewheeling diode Dup21, the source of the transistor Qup22, and the anode of the freewheeling diode Dup22, the drain of the transistor Qlo11, the cathode of the freewheeling diode Dlo11, the drain of the transistor Qlo12, and the cathode of the freewheeling diode Dlo12, and the drain of the transistor Qlo21, the cathode of the freewheeling Dlo21, the drain of the transistor Qlo22, and the cathode of the freewheeling diode Dlo22 are connected to each other.

A gate of the transistor Qup11 is connected to a gate signal input terminal Gup11. The source of the transistor Qup11 is connected to a reference signal input terminal Rup11. The gate signal input terminal Gup11 and the reference signal input terminal Rup11 are connected to a control circuit (unillustrated) for controlling the inverter circuits 112, 122, and 132. The control circuit generates a gate pulse signal by modulating a command value and a reference waveform. The gate pulse signal is applied between the gate signal input terminal Gup11 and the reference signal input terminal Rup11, and is, as a gate-source voltage, applied between the gate and the source of the transistor Qup11. The transistor Qup11 is turned on when the gate pulse signal has a high voltage level, and is turned off when the gate pulse signal has a low voltage level.

A gate of the transistor Qup12 is connected to a gate signal input terminal Gup12. The source of the transistor Qup12 is connected to a reference signal input terminal Rup12. The gate signal input terminal Gup12 and the reference signal input terminal Rup12 are connected to the control circuit (unillustrated) for controlling the inverter circuits 112, 122, and 132. The control circuit generates a gate pulse signal by modulating a command value and a reference waveform. The gate pulse signal is applied between the gate signal input terminal Gup12 and the reference signal input terminal Rup12, and is, as a gate-source voltage, applied between the gate and the source of the transistor Qup12. The transistor Qup12 is turned on when the gate pulse signal has a high voltage level, and is turned off when the gate pulse signal has a low voltage level.

A gate of the transistor Qup21 is connected to a gate signal input terminal Gup21. The source of the transistor Qup21 is connected to a reference signal input terminal Rup21. The gate signal input terminal Gup21 and the reference signal input terminal Rup21 are connected to the control circuit (unillustrated) for controlling the inverter circuits 112, 122, and 132. The control circuit generates a gate pulse signal by modulating a command value and a reference waveform. The gate pulse signal is applied between the gate signal input terminal Gup21 and the reference signal input terminal Rup21, and is, as a gate-source voltage, applied between the gate and the source of the transistor Qup21. The transistor Qup21 is turned on when the gate pulse signal has a high voltage level, and is turned off when the gate pulse signal has a low voltage level.

A gate of the transistor Qup22 is connected to a gate signal input terminal Gup22. The source of the transistor Qup22 is connected to a reference signal input terminal Rup22. The gate signal input terminal Gup22 and the reference signal input terminal Rup22 are connected to the control circuit (unillustrated) for controlling the inverter circuits 112, 122, and 132. The control circuit generates a gate pulse signal by modulating a command value and a reference waveform. The gate pulse signal is applied between the gate signal input terminal Gup22 and the reference signal input terminal Rup22, and is, as a gate-source voltage, applied between the gate and the source of the transistor Qup22. The transistor Qup22 is turned on when the gate pulse signal has a high voltage level, and is turned off when the gate pulse signal has a low voltage level.

Although details will be given later, the semiconductor module 1 according to the present embodiment is configured such that the transistors Qup11, Qup12, Qup21, and Qup22 are simultaneously switched from off to on and simultaneously switched from on to off. Therefore, the gates of the transistors Qup11, Qup12, Qup21, and Qup22 may be connected to a common gate signal input terminal, and the sources of the transistors Qup11, Qup12, Qup21, and Qup22 may be connected to a common reference signal input terminal.

A gate of the transistor Qlo11 is connected to a gate signal input terminal Glo11. The source of the transistor Qlo11 is connected to a reference signal input terminal Rlo11. The gate signal input terminal Glo11 and the reference signal input terminal Rlo11 are connected to the control circuit (unillustrated) for controlling the inverter circuits 112, 122, and 132. The control circuit generates a gate pulse signal by modulating a command value and a reference waveform. The gate pulse signal is applied between the gate signal input terminal Glo11 and the reference signal input terminal Rlo11, and is, as a gate-source voltage, applied between the gate and the source of the transistor Qlo11. The transistor Qlo11 is turned on when the gate pulse signal has a high voltage level, and is turned off when the gate pulse signal has a low voltage level.

A gate of the transistor Qlo12 is connected to a gate signal input terminal Glo12. The source of the transistor Qlo12 is connected to a reference signal input terminal Rlo12. The gate signal input terminal Glo12 and the reference signal input terminal Rlo12 are connected to the control circuit (unillustrated) for controlling the inverter circuits 112, 122, and 132. The control circuit generates a gate pulse signal by modulating a command value and a reference waveform. The gate pulse signal is applied between the gate signal input terminal Glo12 and the reference signal input terminal Rlo12, and is, as a gate-source voltage, applied between the gate and the source of the transistor Qlo12. The transistor Qlo12 is turned on when the gate pulse signal has a high voltage level, and is turned off when the gate pulse signal has a low voltage level.

A gate of the transistor Qlo21 is connected to a gate signal input terminal Glo21. The source of the transistor Qlo21 is connected to a reference signal input terminal Rlo21. The gate signal input terminal Glo21 and the reference signal input terminal Rlo21 are connected to the control circuit (unillustrated) for controlling the inverter circuits 112, 122, and 132. The control circuit generates a gate pulse signal by modulating a command value and a reference waveform. The gate pulse signal is applied between the gate signal input terminal Glo21 and the reference signal input terminal Rlo21, and is, as a gate-source voltage, applied between the gate and the source of the transistor Qlo21. The transistor Qlo21 is turned on when the gate pulse signal has a high voltage level, and is turned off when the gate pulse signal has a low voltage level.

A gate of the transistor Qlo22 is connected to a gate signal input terminal Glo22. The source of the transistor Qlo22 is connected to a reference signal input terminal Rlo22. The gate signal input terminal Glo22 and the reference signal input terminal Rlo22 are connected to the control circuit (unillustrated) for controlling the inverter circuits 112, 122, and 132. The control circuit generates a gate pulse signal by modulating a command value and a reference waveform. The gate pulse signal is applied between the gate signal input terminal Glo22 and the reference signal input terminal Rlo22, and is, as a gate-source voltage, applied between the gate and the source of the transistor Qlo22. The transistor Qlo22 is turned on when the gate pulse signal has a high voltage level, and is turned off when the gate pulse signal has a low voltage level.

When at least one the transistors Qup11, Qup12, Qup21 and Qup22 are turned on and the transistors Qlo11 and Qlo12 and the transistors Qlo21 and Qlo22 are turned off, the positive terminal Pu is connected to the output terminal Ou. On the other hand, when the transistors Qup11 and Qup12 and the transistors Qup21 and Qup22 are turned off and at least one the transistors Qlo11, Qlo12, Qlo21 and Qlo22 are turned on, the negative terminal Nu is connected to the output terminal Ou. As described above, in the semiconductor module 1 according to the present embodiment, the transistors Qup11, Qup12, Qup21, and Qup22 are controlled so as to be simultaneously switched from off to on and simultaneously switched from on to off. Therefore, the gates of the transistors Qup11, Qup12, Qup21, and Qup22 may be connected to a common gate signal input terminal, and the sources of the transistors Qup11, Qup12, Qup21, and Qup22 may be connected to a common reference signal input terminal. In addition, similarly, in the semiconductor module 1 according to the present embodiment, the transistors Qlo11, Qlo12, Qlo21, and Qlo22 are controlled so as to be simultaneously switched from off to on and simultaneously switched from on to off. Therefore, the gates of the transistors Qlo11, Qlo12, Qlo21, and Qlo22 may be connected to a common gate signal input terminal, and the sources of the transistors Qlo11, Qlo12, Qlo21, and Qlo22 maybe connected to a common reference signal input terminal. Furthermore, in the semiconductor module 1 according to the present embodiment, switching operation is controlled so that the transistors Qup11, Qup12, Qup21, and Qup22 and the transistors Qlo11, Qlo12, Qlo21, and Qlo22 are not turned on simultaneously (non-overlap control).

Turn-on/turn-off of the transistors Qup11, Qup12, Qup21, and Qup22 and turn-off/turn-on of the transistors Qlo11, Qlo12, Qlo21, and Qlo22 are alternately repeated, whereby an AC voltage formed from a positive polarity voltage and a negative polarity voltage is output from the output terminal Ou. When a turn-on period of the transistors Qup11, Qup12, Qup21, and Qup22 is longer than a turn-off period of the transistors Qlo11, Qlo12, Qlo21, and Qlo22 in the alternate repetition of the turn-on/turn-off of the transistors Qup11, Qup12, Qup21, and Qup22 and the turn-off/turn-on of the transistors Qlo11, Qlo12, Qlo21, and Qlo22, a voltage level output from the output terminal Ou rises, at a maximum, to a voltage level of the positive polarity voltage supplied to the positive terminal Pu. On the other hand, when a turn-off period of the transistors Qup11, Qup12, Qup21, and Qup22 is longer than a turn-on period of the transistors Qlo11, Qlo12, Qlo21, and Qlo22 in the alternate repetition of the turn-on/turn-off of the transistors Qup11, Qup12, Qup21, and Qup22 and the turn-off/turn-on of the transistors Qlo11, Qlo12, Qlo21, and Qlo22, a voltage level output from the output terminal Ou drops, at a minimum, to a voltage level of the negative polarity voltage supplied to the negative terminal Nu.

By appropriately adjusting a pulse width of the gate pulse signal input to the gate of each of the transistors Qup11, Qup12, Qup21, and Qup22 and a pulse width of the gate pulse signal input to the gate of each of the transistors Qlo11, Qlo12, Qlo21, and Qlo22, the inverter circuit 112 can supply AC power having a desired waveform (for example, sine wave AC power) to the motor from the output terminal Ou to drive the motor.

The inverter circuit 122 has the same configuration as that of the inverter circuit 112 when the positive terminal Pu is replaced by the positive terminal Pv, the negative terminal Nu is replaced by the negative terminal Nv, and the output terminal Ou is replaced by the output terminal Ov. The inverter circuit 132 has the same configuration as that of the inverter circuit 112 when the positive terminal Pu is replaced by the positive terminal Pw, the negative terminal Nu is replaced by the negative terminal Nw, and the output terminal Ou is replaced by the output terminal Ow.

The gate pulse signal input to the gate of each of the transistors Qup11, Qup12, Qup21, and Qup22 provided in the inverter circuit 112, the gate pulse signal input to the gate of each of the transistors Qup11, Qup12, Qup21, and Qup22 provided in the inverter circuit 122, and the gate pulse signal input to the gate of each of the transistors Qup11, Qup12, Qup21, and Qup22 provided in the inverter circuit 132 are different signals from each other.

Additionally, the gate pulse signal input to the gate of each of the transistors Qlo11, Qlo12, Qlo21, and Qlo22 provided in the inverter circuit 112, the gate pulse signal input to the gate of each of the transistors Qlo11, Qlo12, Qlo21, and Qlo22 provided in the inverter circuit 122, and the gate pulse signal input to the gate of each of the transistors Qlo11, Qlo12, Qlo21, and Qlo22 provided in the inverter circuit 132 are different signals from each other.

As a result, the semiconductor module 1 can supply U-phase AC power, V-phase AC power, and W-phase AC power having phases shifted from each other by a predetermined amount to the motor from the output terminals Ou, Ov, and Ow.

Next, the laminated substrates 111, 121, and 131 will be described using FIG. 4 and with reference to FIGS. 1 and 3. The laminated substrates 111, 121, and 131 have the same configuration as each other. Therefore, hereinafter, the laminated substrate 111 will be exemplified to describe the laminated substrates 111, 121, and 131.

Figure 4:
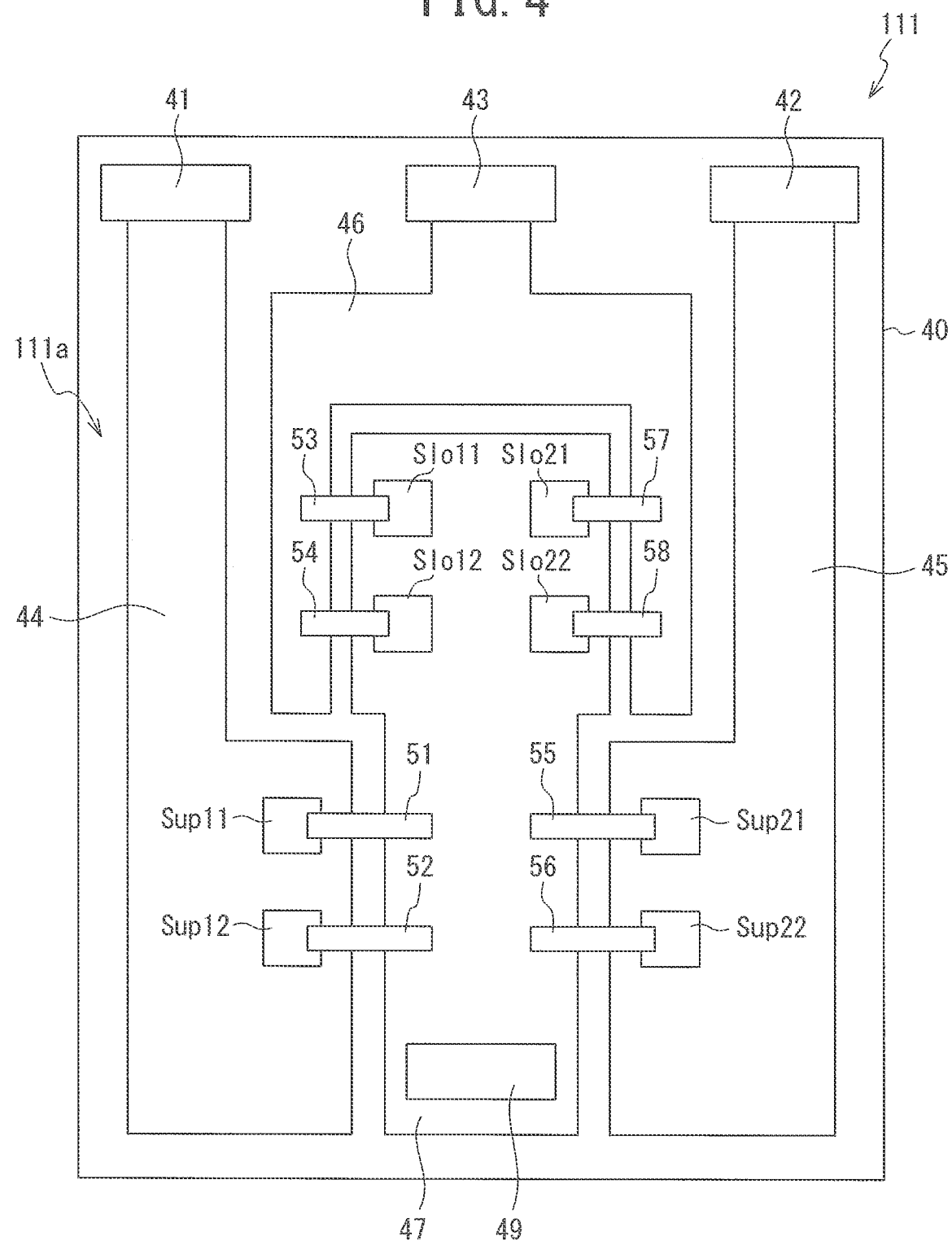
FIG. 4 is a diagram illustrating an example of a wiring pattern formed on a laminated substrate included in the semiconductor module according to the first embodiment of the present invention.

As illustrated in FIG. 4, the laminated substrate 111 has a rectangular insulating substrate 40 and a heat dissipation pattern layer 60 having a predetermined shape (unillustrated in FIG. 4; see FIGS. 7 and 8) formed on a lower surface of the insulating substrate 40. The laminated substrate 111 has a first positive-side input terminal pattern 41, a second positive-side input terminal pattern 42, and a negative-side input terminal pattern 43 formed on one short side of both short sides of the insulating substrate 40. The negative-side input terminal pattern 43 is arranged between the first positive-side input terminal pattern 41 and the second positive-side input terminal pattern 42. The laminated substrate 111 has an output terminal pattern 49 formed on the other short side of the insulating substrate 40. The output terminal pattern 49 is arranged to face the negative-side input terminal pattern 43.

The laminated substrate 111 has a first positive portion pattern 44 formed on the insulating substrate 40 on one long side of both long sides of the insulating substrate 40. The first positive portion pattern 44 is arranged to extend between both the short sides of the insulating substrate 40 along the one long side of the insulating substrate 40. In the first positive portion pattern 44, a pattern width of the other short side of the insulating substrate 40 is larger than a pattern width of the one short side of the insulating substrate 40 relative to a longitudinal center part. The first positive-side input terminal pattern 41 is formed on one end portion of the first positive portion pattern 44. As a result, the first positive portion pattern 44 and the first positive-side input terminal pattern 41 are electrically connected to each other.

The laminated substrate 111 has a second positive portion pattern 45 formed on the insulating substrate 40 on the other long side of both the long sides of the insulating substrate 40. The second positive portion pattern 45 is arranged to extend between both the short sides of the insulating substrate 40 along the other long side of the insulating substrate 40. In the second positive portion pattern 45, a pattern width of the other short side of the insulating substrate 40 is larger than a pattern width of the one short side of the insulating substrate 40 relative to a longitudinal center part. The second positive-side input terminal pattern 42 is formed on one end portion of the second positive portion pattern 45. As a result, the second positive portion pattern 45 and the second positive-side input terminal pattern 42 are electrically connected to each other.

The laminated substrate 111 has a negative portion pattern 46 formed on the insulating substrate 40 between a portion of the first positive portion pattern 44 with a relatively narrow pattern width and a portion of the second positive portion pattern 45 with a relatively narrow pattern width. The negative portion pattern 46 has a bifurcated shape that is stretched out from the one short side of the insulating substrate 40 by a predetermined length and that extends from the stretched portion along each of the first positive portion pattern 44 and the second positive portion pattern 45. The negative-side input terminal pattern 43 is formed at an end portion of the negative portion pattern 46 on the one short side of the insulating substrate 40. As a result, the negative portion pattern 46 and the negative-side input terminal pattern 43 are electrically connected to each other.

The laminated substrate 111 has an output portion pattern 47 formed on the insulating substrate 40 and extending from the other short side of the insulating substrate 40 toward a center part thereof. The output portion pattern 47 is arranged to extend up to a space portion formed by bifurcating the negative portion pattern 46 in the center part of the laminated substrate 111. As a result, a part of the output portion pattern 47 is arranged to be sandwiched between the bifurcated portions of the negative portion pattern 46. The output terminal pattern 49 is formed at an end portion of the output portion pattern 47 on the other short side of the insulating substrate 40. As a result, the output portion pattern 47 and the output terminal pattern 49 are electrically connected to each other.

As illustrated in FIG. 4, on a portion of the first positive portion pattern 44 with a relatively large pattern width, the semiconductor element Sup11 is mounted in electrical connection with the first positive portion pattern 44. As a result, the drain (see FIG. 3) of the transistor Qup11 and the cathode (see FIG. 3) of the freewheeling diode Dup11 included in the semiconductor element Sup11 are electrically connected with the first positive portion pattern 44. Additionally, a connection member 51 made of a conductive material is arranged between the semiconductor element Sup11 and the output portion pattern 47. The connection member 51 is configured by, for example, a copper bar. The connection member 51 is adapted to electrically connect the source (see FIG. 3) of the transistor Qup11 and the anode (see FIG. 3) of the freewheeling diode Dup11 included in the semiconductor element Sup11 with the output portion pattern 47.

On the portion of the first positive portion pattern 44 with the relatively large pattern width, the semiconductor element Sup12 is mounted side by side with the semiconductor element Sup11 while being electrically connected with the first positive portion pattern 44. As a result, the drain (see FIG. 3) of the transistor Qup12 and the cathode (see FIG. 3) of the freewheeling diode Dup12 included in the semiconductor element Sup12 are electrically connected with the first positive portion pattern 44. Additionally, a connection member 52 made of a conductive material is arranged between the semiconductor element Sup12 and the output portion pattern 47. The connection member 52 is configured by, for example, a copper bar. The connection member 52 is adapted to electrically connect the source (see FIG. 3) of the transistor Qup12 and the anode (see FIG. 3) of the freewheeling diode Dup12 included in the semiconductor element Sup12 with the output portion pattern 47.

As illustrated in FIG. 4, on a portion of the second positive portion pattern 45 with a relatively large pattern width, the semiconductor element Sup21 is mounted in electrical connection with the second positive portion pattern 45. As a result, the drain (see FIG. 3) of the transistor Qup21 and the cathode (see FIG. 3) of the freewheeling diode Dup21 included in the semiconductor element Sup21 are electrically connected with the second positive portion pattern 45. Additionally, a connection member 55 made of a conductive material is arranged between the semiconductor element Sup21 and the output portion pattern 47. The connection member 55 is configured by, for example, a copper bar. The connection member 55 is adapted to electrically connect the source (see FIG. 3) of the transistor Qup21 and the anode (see FIG. 3) of the freewheeling diode Dup21 included in the semiconductor element Sup21 with the output portion pattern 47.

On the portion of the second positive portion pattern 45 with the relatively large pattern width, the semiconductor element Sup22 is mounted side by side with the semiconductor element Sup21 while being electrically connected with the second positive portion pattern 45. As a result, the drain (see FIG. 3) of the transistor Qup22 and the cathode (see FIG. 3) of the freewheeling diode Dup22 included in the semiconductor element Sup22 are electrically connected with the second positive portion pattern 45. Additionally, a connection member 56 made of a conductive material is arranged between the semiconductor element Sup22 and the output portion pattern 47. The connection member 56 is configured by, for example, a copper bar. The connection member 56 is adapted to electrically connect the source (see FIG. 3) of the transistor Qup22 and the anode (see FIG. 3) of the freewheeling diode Dup22 included in the semiconductor element Sup22 with the output portion pattern 47.

As illustrated in FIG. 4, on the part of the output portion pattern 47 arranged in the center part of the laminated substrate 111, the semiconductor element Slo11 is mounted in electrical connection with the output portion pattern 47. As a result, the drain (see FIG. 3) of the transistor Qlo11 and the cathode (see FIG. 3) of the freewheeling diode Dlo11 included in the semiconductor element Slo11 are electrically connected with the output portion pattern 47. Additionally, a connection member 53 made of a conductive material is arranged between the semiconductor element Slo11 and the negative portion pattern 46. The connection member 53 is configured by, for example, a copper bar. The connection member 53 is adapted to electrically connect the source (see FIG. 3) of the transistor Qlo11 and the anode (see FIG. 3) of the freewheeling diode Dlo11 included in the semiconductor element Slo11 with the negative portion pattern 46.

On the part of the output portion pattern 47 arranged in the center part of the laminated substrate 111, the semiconductor element Slo12 is mounted side by side with the semiconductor element Slo11 while being electrically connected with the output portion pattern 47. As a result, the drain (see FIG. 3) of the transistor Qlo12 and the cathode (see FIG. 3) of the freewheeling diode Dlo12 included in the semiconductor element Slo12 are electrically connected with the output portion pattern 47. Additionally, a connection member 54 made of a conductive material is arranged between the semiconductor element Slo12 and the negative portion pattern 46. The connection member 54 is configured by, for example, a copper bar. The connection member 54 is adapted to electrically connect the source (see FIG. 3) of the transistor Qlo12 and the anode (see FIG. 3) of the freewheeling diode Dlo12 included in the semiconductor element Slo12 with the negative portion pattern 46.

On the part of the output portion pattern 47 arranged in the center part of the laminated substrate 111, the semiconductor element Slo21 is mounted in electrical connection with the output portion pattern 47. As a result, the drain (see FIG. 3) of the transistor Qlo21 and the cathode (see FIG. 3) of the freewheeling diode Dlo21 included in the semiconductor element Slo21 are electrically connected with the output portion pattern 47. Additionally, a connection member 57 made of a conductive material is arranged between the semiconductor element Slo21 and the negative portion pattern 46. The connection member 57 is configured by, for example, a copper bar. The connection member 57 is adapted to electrically connect the source (see FIG. 3) of the transistor Qlo21 and the anode (see FIG. 3) of the freewheeling diode Dlo21 included in the semiconductor element Slo21 with the negative portion pattern 46.

On the part of the output portion pattern 47 arranged in the center part of the laminated substrate 111, the semiconductor element Slo22 is mounted side by side with the semiconductor element Slo21 while being electrically connected with the output portion pattern 47. As a result, the drain (see FIG. 3) of the transistor Qlo22 and the cathode (see FIG. 3) of the freewheeling diode Dlo22 included in the semiconductor element Slo22 are electrically connected with the output portion pattern 47. Additionally, a connection member 58 made of a conductive material is arranged between the semiconductor element Slo22 and the negative portion pattern 46. The connection member 58 is configured by, for example, a copper bar. The connection member 58 is adapted to electrically connect the source (see FIG. 3) of the transistor Qlo22 and the anode (see FIG. 3) of the freewheeling diode Dlo22 included in the semiconductor element Slo22 with the negative portion pattern 46.

The positive connection portion 22 (see FIG. 5; details will be given later) of the positive terminal Pu is electrically connected to and mounted on the first positive-side input terminal pattern 41. The output terminal Ou (see FIG. 3) is electrically connected to and mounted on the output terminal pattern 49. Accordingly, the semiconductor element Sup11 and the semiconductor element Sup12 are connected in parallel between the positive terminal Pu and the output terminal Ou via the first positive-side input terminal pattern 41 and the first positive portion pattern 44, and via the connection members 51 and 52, the output portion pattern 47, and the output terminal pattern 49.

The positive connection portion 23 (see FIG. 5; details will be given later) of the positive terminal Pu is electrically connected to and mounted on the second positive-side input terminal pattern 42. The output terminal Ou (see FIG. 3) is electrically connected to and mounted on the output terminal pattern 49. Accordingly, the semiconductor element Sup21 and the semiconductor element Sup22 are connected in parallel between the positive terminal Pu and the output terminal Ou via the second positive-side input terminal pattern 42 and the second positive portion pattern 45, and via the connection members 55 and 56, the output portion pattern 47, and the output terminal pattern 49.

The negative connection portion 33 (see FIG. 5; details will be given later) of the negative terminal Nu is electrically connected to and mounted on the negative-side input terminal pattern 43. The output terminal Ou (see FIG. 3) is electrically connected to and mounted on the output terminal pattern 49. Accordingly, the semiconductor element Slo11 and the semiconductor element Slo12 are connected in parallel between the output terminal Ou and the negative terminal Nu via the output portion pattern 47 and the output terminal pattern 49, and via the connection members 53 and 54, the negative portion pattern 46, and the negative-side input terminal pattern 43.

The negative connection portion 33 of the negative terminal Nu is electrically connected to and mounted on the negative-side input terminal pattern 43. The output terminal Ou (see FIG. 3) is electrically connected to and mounted on the output terminal pattern 49. Accordingly, the semiconductor element Slo21 and the semiconductor element Slo22 are connected in parallel between the output terminal Ou and the negative terminal Nu via the output portion pattern 47 and the output terminal pattern 49, and via the connection members 57 and 58, the negative portion pattern 46, and the negative-side input terminal pattern 43. As a result, the inverter circuit 112 has a half-bridge circuit configuration.

Although illustration is omitted, the laminated substrates 121 and 131 also have the same configuration as that of the laminated substrate 111. Therefore, the inverter circuits 122 and 132 each have a half-bridge circuit configuration. Thus, the semiconductor module 1 is configured by a 6-in-1 module in which the U-phase inverter circuit 112 having the half-bridge circuit configuration, the V-phase inverter circuit 122 having the half-bridge circuit configuration, and the W-phase inverter circuit 132 having the half-bridge circuit configuration are combined into a single module.

The first positive portion pattern 44, the second positive portion pattern 45, the negative portion pattern 46, and the output portion pattern 47 are formed adjacent to each other with a predetermined insulation distance to prevent them from being short-circuited with each other. Additionally, all or some of the first positive portion pattern 44, the second positive portion pattern 45, the negative portion pattern 46, and the output portion pattern 47 are sealed and fixed with an insulating resin provided in the case 10 (see FIG. 1). This further improves insulation properties of the first positive portion pattern 44, the second positive portion pattern 45, the negative portion pattern 46, and the output portion pattern 47.

Apart of each of the positive terminal Pu, the negative terminal Nu, and the output terminal Ou is arranged at a periphery of the case 10 and exposed out of the insulating resin provided in the case 10. As a result, the positive terminal Pu can be electrically connected to an external terminal to which positive-side DC power is supplied. Additionally, the negative terminal Nu can be electrically connected to an external terminal to which negative-side DC power is supplied. Furthermore, the output terminal Ou can be electrically connected to a power supply terminal of the motor to be driven.

The laminated substrate 111 is mounted on the heat dissipation base or cooler, and is thermally and mechanically bonded to the heat dissipation base or cooler by means of a material for bonding under substrate (unillustrated). Additionally, as described above, the case 10 is mechanically fixed to the heat dissipation base or cooler. Accordingly, the semiconductor module 1 can discharge heat generated in the semiconductor elements Sup11, Sup12, Sup21, Sup22, Slo11, Slo12, Slo21, and Slo22 to the heat dissipation base or cooler via the laminated substrate 111 and the case 10. As a result, the semiconductor module 1 can prevent the semiconductor elements Sup11, Sup12, Sup21, Sup22, Slo11, Slo12, Slo21, and Slo22 from being damaged due to heat generation.

(Configurations of First Power Supply Terminal and Second Power Supply Terminal)

Next, configurations of the negative terminals Nu, Nv, and Nw (an example of the first power supply terminal) and the positive terminals Pu, Pv, and Pw (an example of the second power supply terminal) included in the semiconductor module 1 according to the present embodiment will be described using FIGS. 5 to 9 and with reference to FIGS. 1 to 4. The negative terminals Nu, Nv, and Nw have the same configuration. Therefore, the negative terminal Nu will be exemplified to describe the configuration of the negative terminals Nu, Nv, and Nw. In addition, the positive terminals Pu, Pv, and Pw have the same configuration. Therefore, the positive terminal Pu will be exemplified to describe the configuration of the positive terminals Pu, Pv, and Pw.

Figure 5:
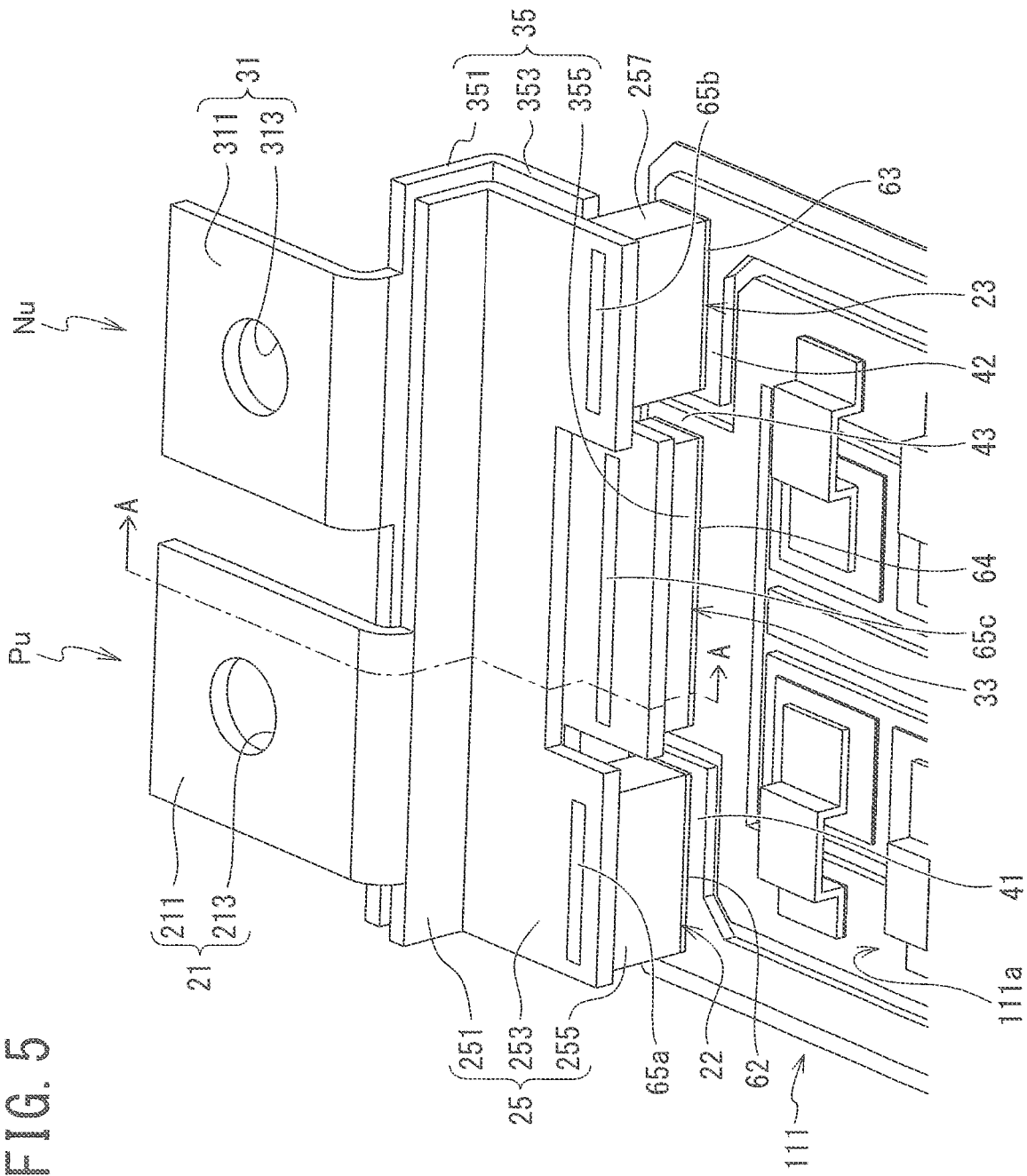
FIG. 5 is a perspective diagram illustrating an example of power supply terminals included in the semiconductor module according to the first embodiment of the present invention.

As illustrated in FIG. 5, the negative terminal Nu has a negative fastening portion (an example of a first fastening portion) 31 for fastening an external terminal (unillustrated) of a negative polarity side, the negative connection portion (an example of a first connection portion) 33 connected to the laminated substrate 111, and a negative intermediate portion (an example of a first intermediate portion) 35 arranged between the negative fastening portion 31 and the negative connection portion 33. The positive terminal Pu has a positive fastening portion (an example of a second fastening portion) 21, which is arranged adjacent to the negative fastening portion 31 and which is for fastening an external terminal (unillustrated) of a positive polarity side, a pair of the positive connection portions (an example of a second connection portion) 22 and 23 arranged across the negative connection portion 33 and connected to the laminated substrate 111, and a positive intermediate portion (an example of a second intermediate portion) 25 at least apart of which faces the negative intermediate portion 35 with a predetermined gap and which is arranged between the positive fastening portion 21 and the pair of positive connection portions 22 and 23.

The negative fastening portion 31 has an arrangement portion 311 for arranging a negative-side external terminal in contact therewith and a through hole 313 formed by penetrating through the arrangement portion 311. The arrangement portion 311 has a flat plate shape. The through hole 313 is formed at a substantially center of the arrangement portion 311. The through hole 313 is provided to mount a jig (for example, a screw or a vis) for fastening the external terminal to the negative fastening portion 31.

The positive fastening portion 21 has an arrangement portion 211 for arranging a positive-side external terminal in contact therewith and a through hole 213 formed by penetrating through the arrangement portion 211. The arrangement portion 211 has a flat plate shape. The through hole 213 is formed at a substantially center of the arrangement portion 211. The through hole 213 is provided to mount a jig (for example, a screw or a vis) for fastening the external terminal to the positive fastening portion 21.

The negative fastening portion 31 and the positive fastening portion 21 overlap one side of the laminated substrate 111 or are positioned outside the one side thereof when a contact surface 111a is viewed in an orthogonal direction, and are arranged along the one side of the laminated substrate 111. Note that viewing the contact surface 111a in the orthogonal direction may be referred to as "planar view of the contact surface 111a". In the present embodiment, the negative fastening portion 31 and the positive fastening portion 21, respectively, are arranged outside an end portion of the laminated substrate 111. More specifically, the arrangement portion 311 of the negative fastening portion 31 and the arrangement portion 211 of the positive fastening portion 21 are arranged in a position outside a short side that is one side of the laminated substrate 111.

The negative fastening portion 31 and the positive fastening portion 21 are arranged side by side along the end portion of the laminated substrate 111. More specifically, additionally, the arrangement portion 311 and the arrangement portion 211 are arrayed adjacent to each other along the one side of the laminated substrate 111. The negative fastening portion 31 and the positive fastening portion 21 are arranged side by side so that a straight line connecting the center of the through hole 313 and the center of the through hole 213 is substantially in parallel to the short side of the laminated substrate 111.

The negative connection portion 33 is a portion of the negative terminal Nu that is in facing contact with the negative-side input terminal pattern 43 (see FIG. 4) formed on the insulating substrate 40 provided on the laminated substrate 111. The pair of positive connection portions 22 and 23 are portions of the positive terminal Pu that are in facing contact with the first positive-side input terminal pattern 41 and the second positive-side input terminal pattern 42 (see FIG. 4) formed on the insulating substrate 40. The negative connection portion 33 and the pair of positive connection portions 22 and 23 are arranged substantially in a straight line in the planar view of the contact surface 111a. The negative connection portion 33 and the pair of positive connection portions 22 and 23 are arranged so as to be substantially in parallel to the short side of the laminated substrate 111 that is parallel to a direction in which the negative fastening portion 31 and the positive fastening portion 21 are lined up in the planar view of the contact surface 111a. Accordingly, the negative connection portion 33 and the pair of positive connection portions 22 and 23 are arranged side by side substantially in parallel to the direction in which the negative fastening portion 31 and the positive fastening portion 21 are lined up in the planar view of the contact surface 111a.

The laminated substrate 111 has the contact surface 111a with which the negative connection portion 33 and the pair of positive connection portions 22 and 23 are contacted. As illustrated in FIGS. 5 to 8, the negative intermediate portion 35 has a negative facing portion (an example of a first facing portion) 353 arranged to face a plane including the contact surface 111a. The negative intermediate portion 35 also has a negative outer extension portion (an example of a first outer extension portion) 351 arranged between the negative facing portion 353 and the negative fastening portion 31 and extending in a direction intersecting with the contact surface 111a. The negative intermediate portion 35 further has a negative inner extension portion (an example of a first inner extension portion) 355 arranged between the negative facing portion 353 and the negative connection portion 33 and extending in the direction intersecting with the contact surface 111a.

The positive intermediate portion 25 has a positive facing portion (an example of a second facing portion) 253 arranged to face the plane including the contact surface 111a. The positive intermediate portion 25 also has a positive outer extension portion (an example of a second outer extension portion) 251 arranged between the positive facing portion 253 and the positive fastening portion 21 and extending in the direction intersecting with the contact surface 111a. The positive intermediate portion 25 further has a pair of positive inner extension portions (an example of a second inner extension portion) 255 and 257 arranged between the positive facing portion 253 and the pair of positive connection portions 22 and 23 and extending in the direction intersecting with the contact surface 111a.

Figure 6A:
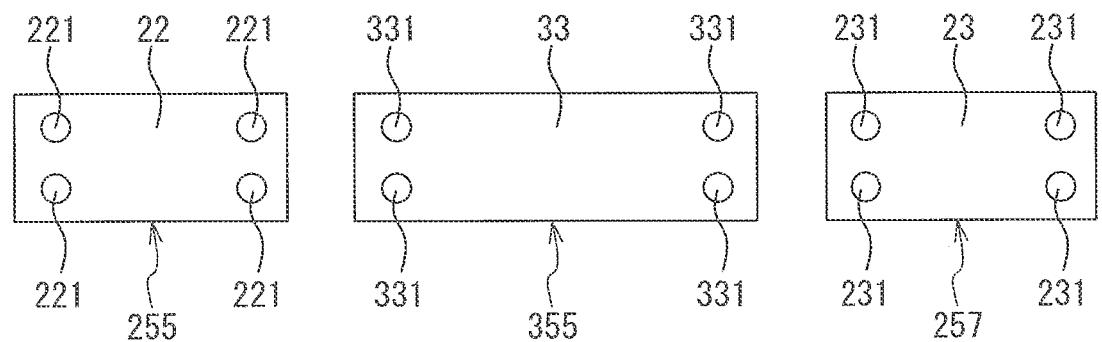
FIGS. 6A and 6B are a schematic diagram for explaining positive connection portions and a negative connection portion of the power supply terminals included in the semiconductor module according to the first embodiment of the present invention.
Figure 6B:
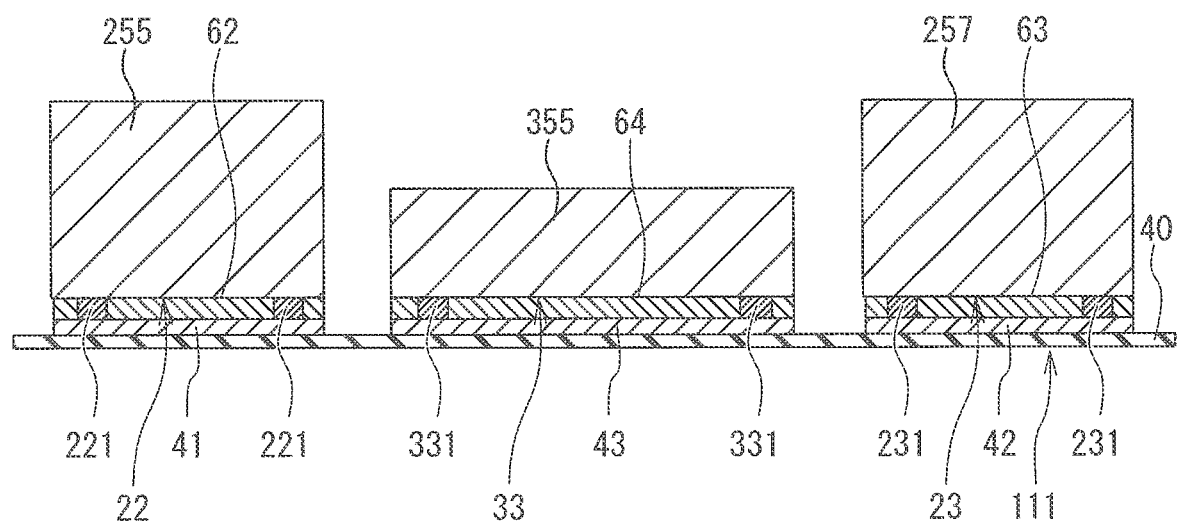

FIG. 6A is a diagram schematically illustrating the positive connection portions 22 and 23 and the negative connection portion 33 as viewed from a side facing the laminated substrate 111. FIG. 6B is a diagram schematically illustrating a cross section obtained by cutting the positive inner extension portions 255 and 257 and the negative inner extension portion 355 mounted on the laminated substrate 111 at positions where a convex portion (see details given later) provided on each of the positive connection portions 22 and 23 and the negative connection portion 33 is formed.

As illustrated in FIG. 6A, the negative connection portion 33 is provided on an end face of the laminated substrate 111 side of the negative inner extension portion 355 of the negative intermediate portion 35. The positive connection portion 22 is provided on an end face of the laminated substrate 111 side of the positive inner extension portion 255 of the positive intermediate portion 25. The positive connection portion 23 is provided on an end face of the laminated substrate 111 side of the positive inner extension portion 257 of the positive intermediate portion 25.

The negative connection portion 33 has a convex portion 331 (an example of a first convex portion) protruding toward the laminated substrate 111. The negative connection portion 33 has the convex portion 331, for example, at each of four corners. The negative connection portion 33 and the four convex portions 331 are, for example, integrally formed. Thus, the four convex portions 331 are integrally formed with, for example, the negative inner extension portion 355.

The positive connection portion 22 has a convex portion 221 (an example of a second convex portion) protruding toward the laminated substrate 111. The positive connection portion 22 has the convex portion 221, for example, at each of four corners. The positive connection portion 22 and the four convex portions 221 are, for example, integrally formed. Thus, the four convex portions 221 are integrally formed with, for example, the positive inner extension portion 255.

The positive connection portion 23 has a convex portion 231 (an example of the second convex portion) protruding toward the laminated substrate 111. The positive connection portion 23 has the convex portion 231, for example, at each of four corners. The positive connection portion 23 and the four convex portions 231 are, for example, integrally formed. Thus, the four convex portions 231 are integrally formed with, for example, the positive inner extension portion 257.

As illustrated in FIG. 6B, the positive connection portion 22 is fixed while being connected to the first positive-side input terminal pattern 41 by, for example, a solder 62. The positive connection portion 23 is fixed while being connected to the second positive-side input terminal pattern 42 by, for example, a solder 63. The negative connection portion 33 is fixed while being connected to the negative-side input terminal pattern 43 by, for example, a solder 64.

The four convex portions 221 provided on the positive connection portion 22 have a height that can ensure a thickness of the solder 62. Here, the height of each convex portion 221 is a length from the positive connection portion 22 to an end portion of the convex portion 221 of the laminated substrate 111 side. Similarly, the four convex portions 231 provided on the positive connection portion 23 have a height that can ensure a thickness of the solder 63. Here, the height of each convex portion 231 is a length from the positive connection portion 23 to an end portion of the convex portion 231 of the laminated substrate 111 side.

Similarly, the four convex portions 331 provided on the negative connection portion 33 have a height that can ensure a thickness of the solder 64. Here, the height of each convex portion 331 is a length from the negative connection portion 33 to an end portion of the convex portion 331 of the laminated substrate 111 side. In this way, by having the convex portions 221 in the positive connection portion 22, the convex portions 231 in the positive connection portion 23, and the convex portions 331 in the negative connection portion 33, the semiconductor module 1 can achieve improved stability of the positive terminal Pu and the negative terminal Nu mounted to the laminated substrate 111.

Figure 7:
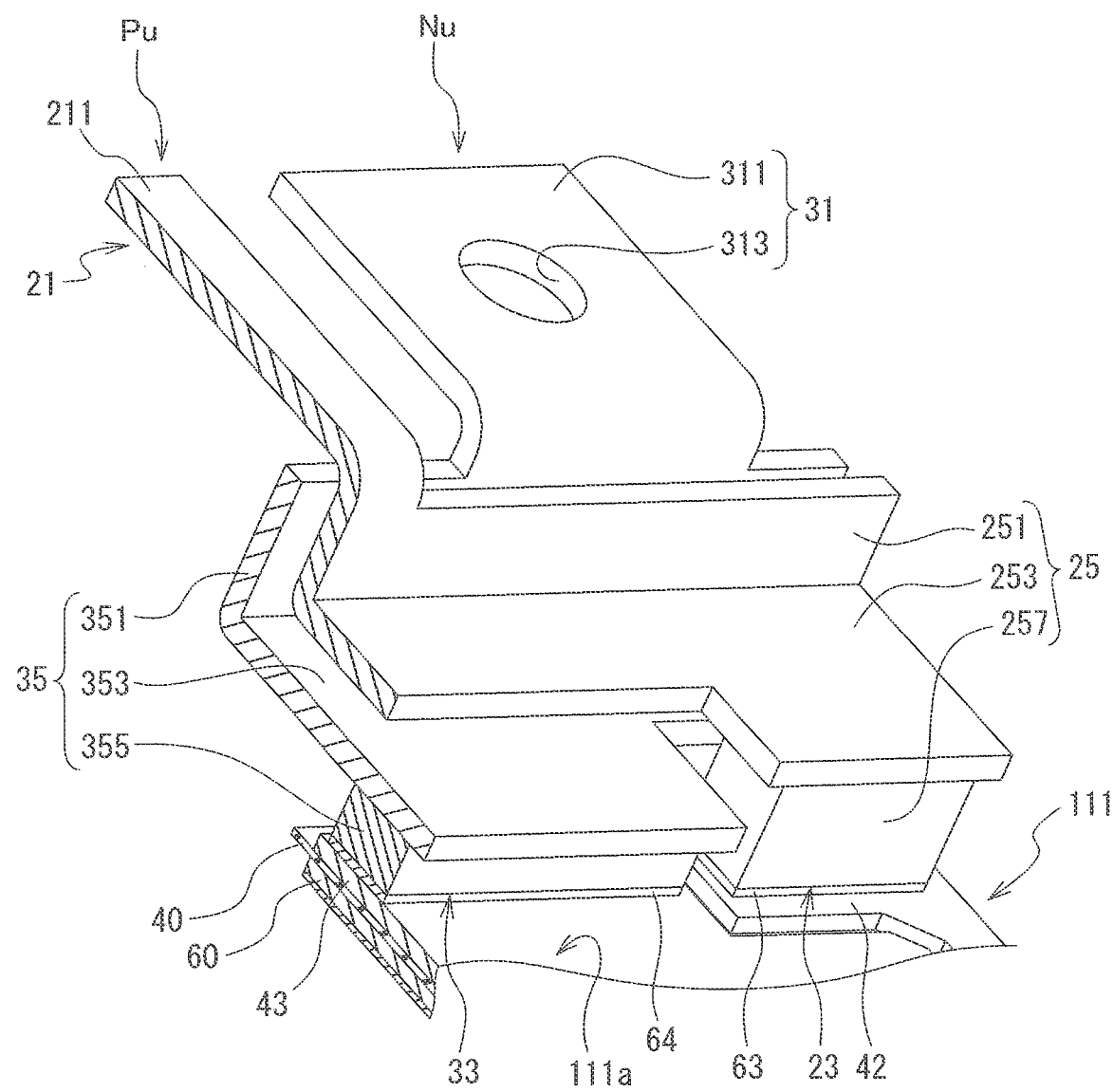
FIG. 7 is a cross-sectional perspective diagram illustrating an example of the power supply terminals included in the semiconductor module according to the first embodiment of the present invention.
Figure 8:
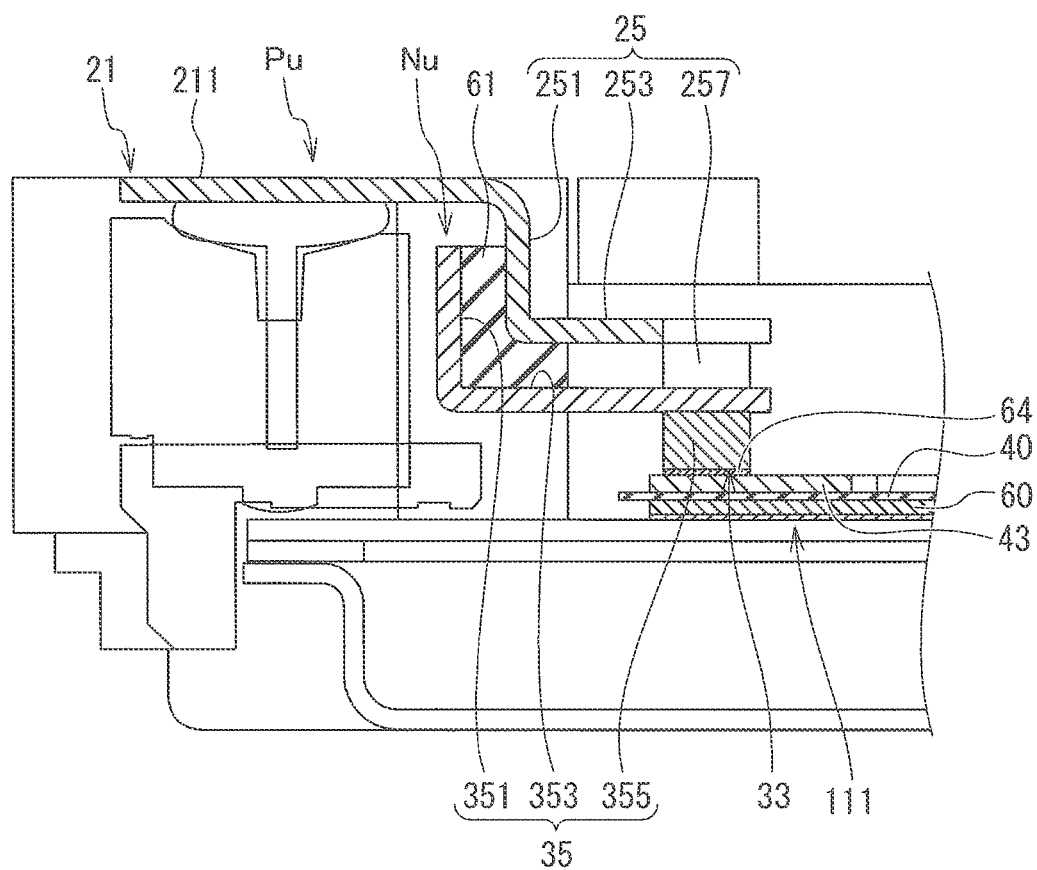
FIG. 8 is a cross-sectional diagram illustrating an example of the power supply terminals included in the semiconductor module according to the first embodiment of the present invention.

As illustrated in FIGS. 7 and 8, the negative intermediate portion 35 is configured as the negative inner extension portion 355, the negative facing portion 353 continuous to the negative inner extension portion 355, and the negative outer extension portion 351 continuous to the negative facing portion 353, starting from one closest to the negative connection portion 33 as viewed in a transverse direction (a short side extension direction) of the laminated substrate 111 and an in-plane direction of the contact surface 111a, and an end portion of the negative outer extension portion 351 is connected to the negative fastening portion 31. Hereinafter, viewing in the transverse direction (the short side extension direction) of the laminated substrate 111 and the in-plane direction of the contact surface 111a may be referred to as "side view of the laminated substrate 111".

The positive intermediate portion 25 has the pair of positive inner extension portions 255 and 257, the positive facing portion 253 continuous to the pair of positive inner extension portions 255 and 257, and the positive outer extension portion 251 continuous to the positive facing portion 253, starting from one closest to the pair of positive connection portions 22 and 23 in the side view of the laminated substrate 111, and an end portion of the positive outer extension portion 251 is connected to the positive fastening portion 21.

The negative facing portion 353 and the positive facing portion 253 are arranged to face each other with a predetermined gap. The negative outer extension portion 351 and the positive outer extension portion 251 are arranged to face each other with a predetermined gap. As a result, the negative facing portion 353 and the positive facing portion 253 are insulated from each other, and the negative outer extension portion 351 and the positive outer extension portion 251 are insulated from each other. In other words, the negative intermediate portion 35 and the positive intermediate portion 25 are insulated from each other.

The negative intermediate portion 35 has the negative outer extension portion 351 and the negative inner extension portion 355 arranged to intersect with (in the present embodiment, substantially orthogonal to) the plane including the contact surface 111a and the negative facing portion 353 sandwiched between the negative outer extension portion 351 and the negative inner extension portion 355 and arranged to face (in the present embodiment, substantially in parallel to) the plane including the contact surface 111a. The negative outer extension portion 351 and the negative facing portion 353 are formed by bending a single plate-like member, and, together with the negative inner extension portion 355, form a staircase shape. Thus, the negative intermediate portion 35 has the staircase shape.

The negative fastening portion 31 is also formed by bending a part of the plate-like member forming the negative outer extension portion 351 and the negative facing portion 353. The negative fastening portion 31 is formed by bending a part of the plate-like member to become the negative fastening portion 31 to a side opposite to a direction in which a part of the plate-like member to become the negative outer extension portion 351 is bent with respect to a part of the plate-like member to become the negative facing portion 353. Thus, the negative fastening portion 31, the negative outer extension portion 351, and the negative facing portion 353 are integrally formed.

The positive intermediate portion 25 has the positive outer extension portion 251 and the positive inner extension portion 255 arranged to intersect with (in the present embodiment, substantially orthogonal to) the plane including the contact surface 111a and the positive facing portion 253 sandwiched between the positive outer extension portion 251 and the positive inner extension portion 255 and arranged to face (in the present embodiment, substantially in parallel to) the plane including the contact surface 111a. The positive outer extension portion 251 and the positive facing portion 253 are formed by bending a single plate-like member, and, together with the pair of positive inner extension portions 255 and 257, form a staircase shape. Thus, the positive intermediate portion 25 has the staircase shape following the shape of the negative intermediate portion 35.

The positive fastening portion 21 is also formed by bending a part of the plate-like member forming the positive outer extension portion 251 and the positive facing portion 253. The positive fastening portion 21 is formed by bending a part of the plate-like member to become the positive fastening portion 21 to a side opposite to a direction in which a part of the plate-like member to become the positive outer extension portion 251 is bent with respect to a part of the plate-like member to become the positive facing portion 253. Thus, the positive fastening portion 21, the positive outer extension portion 251, and the positive facing portion 253 are integrally formed.

The positive facing portion 253 is arranged to cover the negative facing portion 353 while exposing a part of the negative facing portion 353 between the pair of positive inner extension portions 255 and 257. A part of the negative facing portion 353 exposed between the pair of positive inner extension portions 255 and 257 is bonded to the negative inner extension portion 355 formed into a prismatic shape. The part of the negative facing portion 353 and the negative inner extension portion 355 are bonded to each other by laser welding. Parts of the positive facing portion 253 located on both sides of the part of the negative facing portion 353 are bonded to the pair of positive inner extension portions 255 and 257 formed into a prismatic shape. The parts of the positive facing portion 253 and the pair of positive inner extension portions 255 and 257 are bonded to each other by laser welding.

In the present embodiment, the positive facing portion 253 and the pair of positive inner extension portions 255 and 257 are bonded to each other by, for example, seam welding, and the negative facing portion 353 and the negative inner extension portion 355 are bonded to each other by, for example, seam welding. Therefore, as illustrated in FIG. 5, a linearly straight bonded portion 65c is formed across a part of the negative facing portion 353 and the negative inner extension portion 355. Additionally, a linearly straight bonded portion 65a is formed across a part of the positive facing portion 253 on one of both sides of the part of the negative facing portion 353 and the positive inner extension portion 255. Furthermore, a linearly straight bonded portion 65b is formed across a part of the positive facing portion 253 on the other one of both sides of the part of the negative facing portion 353 and the positive inner extension portion 257. The bonded portion 65c, which is a bonding position between the negative inner extension portion 355 and the negative facing portion 353 and the bonded portions 65a and 65b, which are bonding positions between the pair of positive inner extension portions 255 and 257 and the positive facing portion 253, are provided substantially in a straight line. The bonded portion 65c and the bonded portions 65a and 65b are provided side by side in the direction in which the negative fastening portion 31 and the positive fastening portion 21 are lined up. Note that FIGS. 7 and 8 omit illustration of the bonded portions 65a, 65b, and 65c.

As illustrated in FIG. 5, the positive outer extension portion 251 has a rectangular thin-plate shape. Additionally, the positive facing portion 253 has a U-shaped thin-plate shape in the planar view of the contact surface 111a. The positive outer extension portion 251 and the positive facing portion 253 are formed by bending a single plate-like member at substantially 90 degrees. Therefore, the parts of the positive intermediate portion 25 that form the positive outer extension portion 251 and the positive facing portion 253 make an L-shape in the side view of the laminated substrate 111. The negative outer extension portion 351 has a rectangular thin-plate shape. Additionally, the negative facing portion 353 has a T-shaped thin-plate shape in the planar view of the contact surface 111a. The negative outer extension portion 351 and the negative facing portion 353 are formed by bending a single plate-like member at substantially 90 degrees. Therefore, the parts of the negative intermediate portion 35 that form the negative outer extension portion 351 and the negative facing portion 353 make an L-shape in the side view of the laminated substrate 111. Accordingly, as illustrated in FIG. 8, the positive outer extension portion 251 and the positive facing portion 253 and the negative outer extension portion 351 and the negative facing portion 353 have substantially the same cross-sectional shape when taken in a direction orthogonal to the transverse direction of the laminated substrate 111.

As illustrated in FIG. 8, the semiconductor module 1 includes a resin layer 61 provided at least in the predetermined gap between the negative outer extension portion 351 and the positive outer extension portion 251 and the predetermined gap between the negative facing portion 353 and the positive facing portion 253. The resin layer 61 preferably has a relative permittivity of, for example, 3 or more. As described above, the negative outer extension portion 351 and the positive outer extension portion 251 each has a flat plate shape. In addition, the negative facing portion 353 and the positive facing portion 253 each has a flat plate shape. Accordingly, the negative outer extension portion 351 and the positive outer extension portion 251 are capacitively coupled to each other by the resin layer 61 between the negative outer extension portion 351 and the positive outer extension portion 251. Additionally, the negative facing portion 353 and the positive facing portion 253 are capacitively coupled to each other by the resin layer 61 between the negative facing portion 353 and the positive facing portion 253. Thus, the negative terminal Nu and the positive terminal Pu are capacitively coupled to each other by the resin layer 61.

(Effects of Semiconductor Module)

Figure 9:
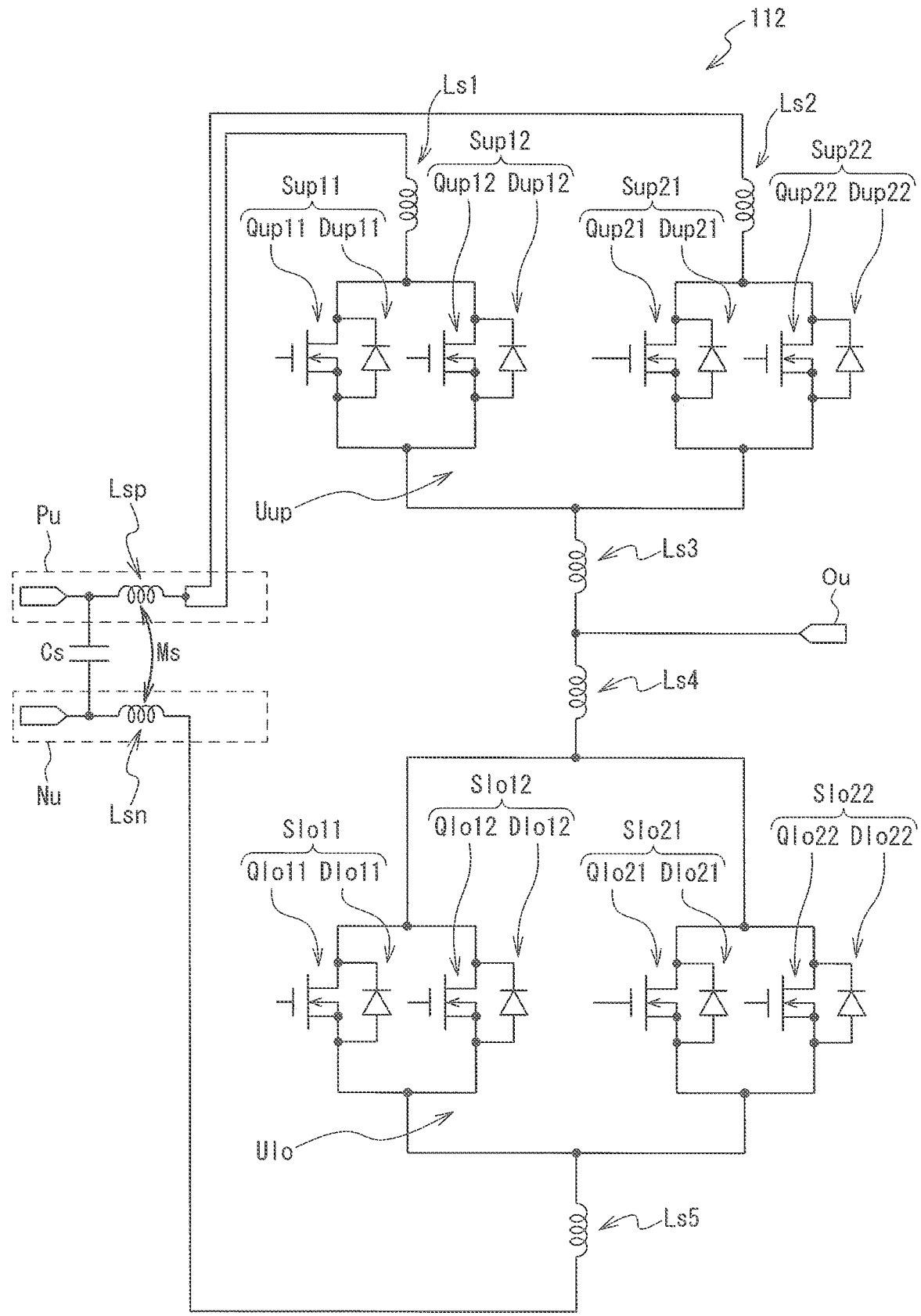
FIG. 9 is a circuit diagram for explaining effects of the semiconductor module according to the first embodiment of the present invention.

Effects of the semiconductor module 1 according to the present embodiment will be described using FIG. 9 and with reference to FIGS. 1 to 8. FIG. 9 is an equivalent circuit including parasitic components of the inverter circuit 112 included in the semiconductor module 1 according to the present embodiment. For ease of understanding, FIG. 9 omits illustration of the gate signal input terminals Gup11, Gup12, Gup21, Gup22, Glo11, Glo12, Glo21, and Glo22 and the reference signal input terminals Rup11, Rup12, Rup21, Rup22, Rlo11, Rlo12, Rlo21, and Rlo22.

As illustrated in FIG. 9, a parasitic inductance Ls1 is formed between the positive terminal Pu and the semiconductor elements Sup11 and Sup12. The parasitic inductance Ls1 is formed by the first positive portion pattern 44 of the laminated substrate 111. Therefore, the parasitic inductance Ls1 is formed between the drain of the transistor Qup11 and the cathode of the freewheeling diode Dup11 included in the semiconductor element Sup11 and the drain of the transistor Qup12 and the cathode of the freewheeling diode Dup12 included in the semiconductor element Sup12 and the positive connection portion 22 of the positive terminal Pu.

As illustrated in FIG. 9, a parasitic inductance Ls2 is formed between the positive terminal Pu and the semiconductor elements Sup21 and Sup22. The parasitic inductance Ls2 is formed by the second positive portion pattern 45 of the laminated substrate 111. Therefore, the parasitic inductance Ls2 is formed between the drain of the transistor Qup21 and the cathode of the freewheeling diode Dup21 included in the semiconductor element Sup21 and the drain of the transistor Qup22 and the cathode of the freewheeling diode Dup22 included in the semiconductor element Sup22 and the positive connection portion 23 of the positive terminal Pu.

As illustrated in FIG. 9, a parasitic inductance Ls3 is formed between the semiconductor elements Sup11 and Sup12 and the semiconductor elements Sup21 and Sup22 and the output terminal Ou. The parasitic inductance Ls3 is formed by the connection members 51, 52, 55, and 56 provided between the semiconductor elements Sup11, Sup12, Sup21, and Sup22 and the output portion pattern 47 and the output portion pattern 47. Therefore, the parasitic inductance Ls3 is formed between the source of the transistor Qup11 and the anode of the freewheeling diode Dup11, the source of the transistor Qup12 and the anode of the freewheeling diode Dup12, the source of the transistor Qup21 and the anode of the freewheeling diode Dup21, and the source of the transistor Qup22 and the anode of the freewheeling diode Dup22 and the output terminal Ou.

As illustrated in FIG. 9, a parasitic inductance Ls4 is formed between the semiconductor elements Slo11 and Slo12 and the semiconductor elements Slo21 and Slo22 and the output terminal Ou. The parasitic inductance Ls4 is formed by the output portion pattern 47 provided between the semiconductor elements Slo11, Slo12, Slo21, and Slo22 and the output terminal pattern 49. Therefore, the parasitic inductance Ls4 is formed between the drain of the transistor Qlo11 and the cathode of the freewheeling diode Dlo11, the drain of the transistor Qlo12 and the cathode of the freewheeling diodeDlo12, the drain of the transistor Qlo21 and the cathode of the freewheeling diode Dlo21, and the drain of the transistor Qlo22 and the cathode of the freewheeling diode Dlo22 and the output terminal Ou.

As illustrated in FIG. 9, a parasitic inductance Ls5 is formed between the semiconductor elements Slo11 and Slo12 and the semiconductor elements Slo21 and Slo22 and the negative terminal Nu. The parasitic inductance Ls5 is formed by the negative portion pattern 46 of the laminated substrate 111 and the connection members 53, 54, 57, and 58. Therefore, the parasitic inductance Ls5 is formed between the source of the transistor Qlo11 and the anode of the freewheeling diode Dlo11, the source of the transistor Qlo12 and the anode of the freewheeling diode Dlo12, the source of the transistor Qlo21 and the anode of the freewheeling diode Dlo21, and the source of the transistor Qlo22 and the anode of the freewheeling diode Dlo22 and the negative connection portion 33 of the negative terminal Nu.

As illustrated in FIG. 9, a parasitic inductance Lsp is formed in the positive terminal Pu. The parasitic inductance Lsp is formed in the positive fastening portion 21, the positive intermediate portion 25, and the pair of positive connection portions 22 and 23. Additionally, a parasitic inductance Lsn is formed in the negative terminal Nu. The parasitic inductance Lsn is formed in the negative fastening portion 31, the negative intermediate portion 35, and the negative connection portion 33.

As illustrated in FIG. 9, a parasitic mutual inductance Ms is formed between the positive terminal Pu and the negative terminal Nu. Additionally, the positive outer extension portion 251 of the positive intermediate portion 25 and the negative outer extension portion 351 of the negative intermediate portion 35 are arranged to face in close proximity to each other with a predetermined gap (for example, a gap of from 0.5 mm to 2 mm) and in a shape that follows each other. The positive facing portion 253 of the positive intermediate portion 25 and the negative facing portion 353 of the negative intermediate portion 35 are arranged to face in close proximity to each other with a predetermined gap (for example, a gap of from 0.5 mm to 2 mm) and in a shape that follows each other. As a result, a parasitic capacitance Cs is formed between the positive terminal Pu and the negative terminal Nu.

In the inverter circuit 112 having the half-bridge circuit configuration, when switching operation of the semiconductor elements Sup11, Sup12, Sup21, and Sup22 and the semiconductor elements Slo11, Slo12, Slo21, and Slo22 are performed, a surge voltage $\Delta Vs$ superimposed on a DC voltage Vdc is applied to the transistors Qup11, Qup12, Qup21, and Qup22 or the transistors Qlo11, Qlo12, Qlo21, and Qlo22 that are in an on state (closed state) of either the upper arm Uup or the lower arm Ulo. When the surge voltage $\Delta Vs$ increases beyond a cutoff withstand voltage of the semiconductor elements Sup11, Sup12, Sup21, Sup22, Slo11, Slo12, Slo21, and Slo22, the semiconductor elements Sup11, Sup12, Sup21, Sup22, Slo11, Slo12, Slo21, and Slo22 maybe broken down. Therefore, the surge voltage $\Delta Vs$ needs to be suppressed.

The surge voltage $\Delta Vs$ can be expressed by equation (1) below using a current change $\partial Is/\partial t$ of a surge current Is and a loop inductance Lall of the inverter circuit 112:

$$\Delta Vs = -Lall \times (\partial Is/\partial t) \tag{1}$$

The loop inductance Lall is an inductance formed in the entire inverter circuit 112 when rounding though the inverter circuit 112 once in an order of "positive terminal Pu→upper arm Uup→lower arm Ulo→negative terminal Nu" or in a reverse order thereof. When a synthetic parasitic inductance of the parasitic inductance Ls1 and the parasitic inductance Ls2 is assumed to be a synthetic parasitic inductance Ls, the loop inductance Lall can be expressed by equation (2) below:

$$Lall = (Ls + Ls3 + Ls4 + Ls5) + (Lsp + Lsn - 2Ms) \tag{2}$$

Incidentally, power semiconductor elements using a wide-bandgap (WBG) substrate enable switching at high withstand voltage and at large current by a MOS device. Power semiconductor elements using a WBG substrate have become capable of increasing switching speed and reducing switching loss compared to insulated gate bipolar transistor (IGBT) devices using a Si substrate. However, along with the increased switching speed of power semiconductor elements, a current change in surge current generated at the time of switching operation also tends to increase, so that surge voltage suppression is an urgent issue.

As indicated in equation (2), the loop inductance Lall can be reduced by increasing the parasitic mutual inductance Ms. The positive terminal Pu and the negative terminal Nu included in the semiconductor module 1 according to the present embodiment are stacked and arranged in close proximity to each other. This allows for mutual influence between change in a current amount of current flowing through the positive terminal Pu and change in a current amount of current flowing through the negative terminal Nu. Thus, the positive terminal Pu and the negative terminal Nu included in the semiconductor module 1 according to the present embodiment are configured such that the parasitic mutual inductance Ms increases according to the shape of the positive terminal Pu itself, the shape of the negative terminal Nu itself, and a relative arrangement relationship between the positive terminal Pu and the negative terminal Nu compared to conventional terminal structures. Therefore, the semiconductor module 1 achieves increased parasitic mutual inductance Ms in the positive terminal Pu and the negative terminal Nu. This can reduce the loop inductance Lall of the inverter circuit 112.

Although illustration is omitted, the inverter circuit 122 and the inverter circuit 132 also have the same configuration as that of the inverter circuit 112. Thus, similarly, even in the inverter circuits 122 and 132, increased parasitic mutual inductance Ms in the positive terminal Pu and the negative terminal Nu is achieved. This can reduce the loop inductance Lall of each of the inverter circuits 122 and 132.

Reducing the loop inductance Lall of each of the inverter circuits 112, 122, and 132 can reduce the surge voltage ΔVs generated when switching the semiconductor elements Sup11, Sup12, Sup21, Sup22, Slo11, Slo12, Slo21, and Slo22 included in each of the inverter circuits 112, 122, and 132 (see equation (1)).

The positive outer extension portion 251 and the positive facing portion 253 of the positive intermediate portion 25 included in the positive terminal Pu and the negative outer extension portion 351 and the negative facing portion 353 of the negative intermediate portion 35 included in the negative terminal Nu, respectively, have a flat plate shape. Additionally, the positive outer extension portion 251 and the negative outer extension portion 351 are arranged to face each other with a substantially constant gap, and the positive facing portion 253 and the negative facing portion 353 are arranged to face each other with a substantially constant gap. Accordingly, the positive outer extension portion 251 and the negative outer extension portion 351 can be regarded as parallel flat plates arranged to face each other, and the positive facing portion 253 and the negative facing portion 353 can be regarded as parallel flat plates arranged to face each other. Using a total facing area "S" of a facing area between the positive outer extension portion 251 and the negative outer extension portion 351 and a facing area between the positive facing portion 253 and the negative facing portion 353, a gap "d" between the positive outer extension portion 251 and the negative outer extension portion 351, and a gap "d" between the positive facing portion 253 and the negative facing portion 353, the parasitic capacitance Cs can be expressed by equation (3) below:

$$Cs = \varepsilon s \times \varepsilon 0 \times (S/d) \quad (3)$$

In equation (3), εs represents the relative permittivity of a substance arranged in the gap "d", and ε0 represents the permittivity of vacuum.

As described above, the resin layer 61 is provided in at least a part between the positive intermediate portion 25 of the positive terminal Pu and the negative intermediate portion 35 of the negative terminal Nu. The resin layer 61 is made of, for example, poly phenylene sulfide resin (PPS). As a result, the relative permittivity of the resin layer 61 becomes approximately 4, which is larger than 1. When compared to a case where there is air (relative permittivity: 1) between the positive terminal Pu and the negative terminal Nu without providing the resin layer 61, providing the resin layer 61 between the positive terminal Pu and the negative terminal Nu increases a capacitance value of the parasitic capacitance Cs. The resin layer 61 is formed using PPS so as to have a relative permittivity of, for example, 3.

When the parasitic capacitance Cs between the positive terminal Pu and the negative terminal Nu has a large capacitance value, a degree of coupling between the positive terminal Pu and the negative terminal Nu increases, so that the parasitic mutual inductance Ms becomes large. Therefore, the loop inductance Lall of the inverter circuit 112 becomes small (see equation (2)), which reduces the surge voltage ΔVs.

As described above, the semiconductor module 1 can reduce the loop inductance Lall of each of the inverter circuits 112, 122, and 132 by the structures of the positive terminal Pu and the negative terminal Nu. It is therefore unnecessary to reduce the loop inductance Lall by a circuit pattern layer such as the first positive portion pattern 44 included in the laminated substrates 111, 121, and 131. As a result, in the semiconductor module 1, the circuit pattern layer can be simplified, so that miniaturization of the laminated substrates 111, 121, and 131 can be achieved. Additionally, in the semiconductor module 1, miniaturizing the laminated substrates 111, 121, and 131 enables miniaturization of the entire structure including the case 10. Furthermore, the semiconductor module 1 can achieve reduced manufacturing cost by miniaturization.

As described hereinabove, the semiconductor module 1 according to the present embodiment can achieve miniaturization and reduced manufacturing cost while suppressing surge voltage generated when switching the semiconductor elements.

(Modifications)

A semiconductor module according to a modification of the present embodiment will be described using FIG. 10 and with reference to FIGS. 5 to 8. The semiconductor module according to the present modification has the same configuration as that of the semiconductor module 1 according to the present embodiment except that the resin layer has a different shape. Therefore, the same reference signs are given to components having the same effects and functions as those of the components of the semiconductor module 1 according to the present embodiment, and the description thereof will be omitted.

Figure 10:
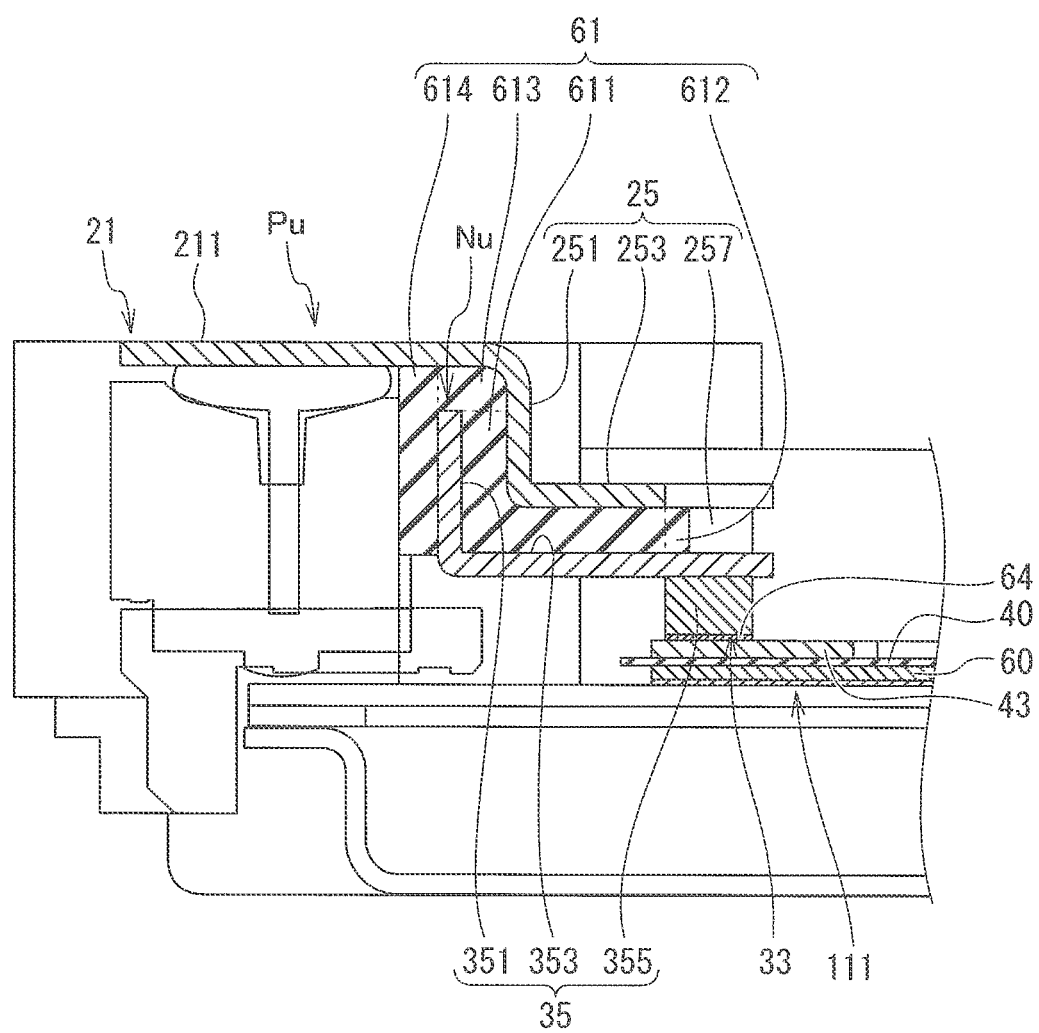
FIG. 10 is a cross-sectional diagram illustrating an example of power supply terminals included in a semiconductor module according to a modification of the first embodiment of the present invention.

As illustrated in FIG. 10, the resin layer 61 included in the present modification is formed in a region of the negative facing portion 353 that is not facing the positive facing portion 253. Specifically, the resin layer 61 has a first portion 611 corresponding to the resin layer 61 (see FIG. 8) included in the present embodiment and a second portion 612 formed on a part of the negative facing portion 353 exposed between the pair of the positive inner extension portion 255 (unillustrated in FIG. 10; see FIG. 5) and the positive inner extension portion 257. The second portion 612 is formed like a terrace on a part of the negative facing portion 353. The second portion 612 is formed so as not interfere with a region where the negative facing portion 353 and the negative inner extension portion 355 are to be laser welded. In other words, the second portion 612 is formed into such a size as not to be located in a place where the bonded portion 65c (unillustrated in FIG. 10; see FIG. 5) is to be formed. In this way, by having the second portion 612 in the resin layer 61, an insulation distance between the positive facing portion 253 and the negative facing portion 353 can be surely provided even when the first portion 611 is made thinner in thickness.

As illustrated in FIG. 10, the resin layer 61 is formed to cover at least one of a side end portion of the negative outer extension portion 351 on a side provided with the negative fastening portion 31 (unillustrated in FIG. 10; see FIG. 5) and a side end portion of the positive outer extension portion 251 on a side provided with the positive fastening portion 21. In other words, the resin layer 61 has a third portion 613 formed between the side end portion (an upper end portion) of the negative outer extension portion 351 and the positive fastening portion 31. The resin layer 61 allows insulation between the negative outer extension portion 351 and the positive fastening portion 31 to be ensured by the third portion 613. Additionally, although illustration is omitted, forming the resin layer 61 so as to cover a side end portion (an upper end portion) of the positive outer extension portion 251 on a side provided with the positive fastening portion 21 can ensure insulation between the positive outer extension portion 251 and the negative fastening portion 31.

As illustrated in FIG. 10, the resin layer 61 is formed to cover a backside of a facing surface of the negative outer extension portion 351 that is facing the positive outer extension portion 251. In other words, the resin layer 61 has a fourth portion 614 formed to cover the backside of the facing surface of the negative outer extension portion 351 that is facing the positive outer extension portion 251. Having the fourth portion 614 in the resin layer 61 can surely provide an insulation distance between the negative outer extension portion 351 and the positive fastening portion 31.

The first portion 611, the second portion 612, the third portion 613, and the fourth portion 614 may be formed using the same material in a single sequence. Alternatively, the first portion 611, the second portion 612, the third portion 613, and the fourth portion 614 may be made of different materials from each other. Alternatively, the first portion 611, the second portion 612, the third portion 613, and the fourth portion 614 may be made of the same material in any combination.

In the present modification, the resin layer 61 has the second portion 612, the third portion 613, and the fourth portion 614, but may have one or two of the second portion 612, the third portion 613, and the fourth portion 614. For example, when the insulation distance between the positive facing portion 253 and the negative facing portion 353 is not sufficiently surely provided and the insulation between the positive outer extension portion 251 and the negative fastening portion 31 is sufficiently surely provided, the resin layer 61 may have the second portion 612 and does not have the third portion 613 and the fourth portion 614. Alternatively, for example, when the insulation distance between the positive facing portion 253 and the negative facing portion 353 is sufficiently surely provided and the insulation between the positive outer extension portion 251 and the negative fastening portion 31 is not sufficiently surely provided, the resin layer 61 does not have the second portion 612 and may have the third portion 613 and the fourth portion 614.

Second Embodiment

A semiconductor module according to a second embodiment of the present invention will be described using FIGS. 11 and 12. The semiconductor module according to the present embodiment has the same configuration as that of the semiconductor module 1 according to the above-described first embodiment except that the configurations of the positive terminal and the negative terminal are different. Therefore, the same reference signs are given to components having the same effects and functions as those of the semiconductor module 1 according to the first embodiment, and the description thereof will be omitted. First, a schematic structure of the semiconductor module according to the present embodiment will be described using FIG. 11. In the present embodiment, a power conversion module capable of converting DC to AC power will be described as an example of the semiconductor module.

Figure 11:
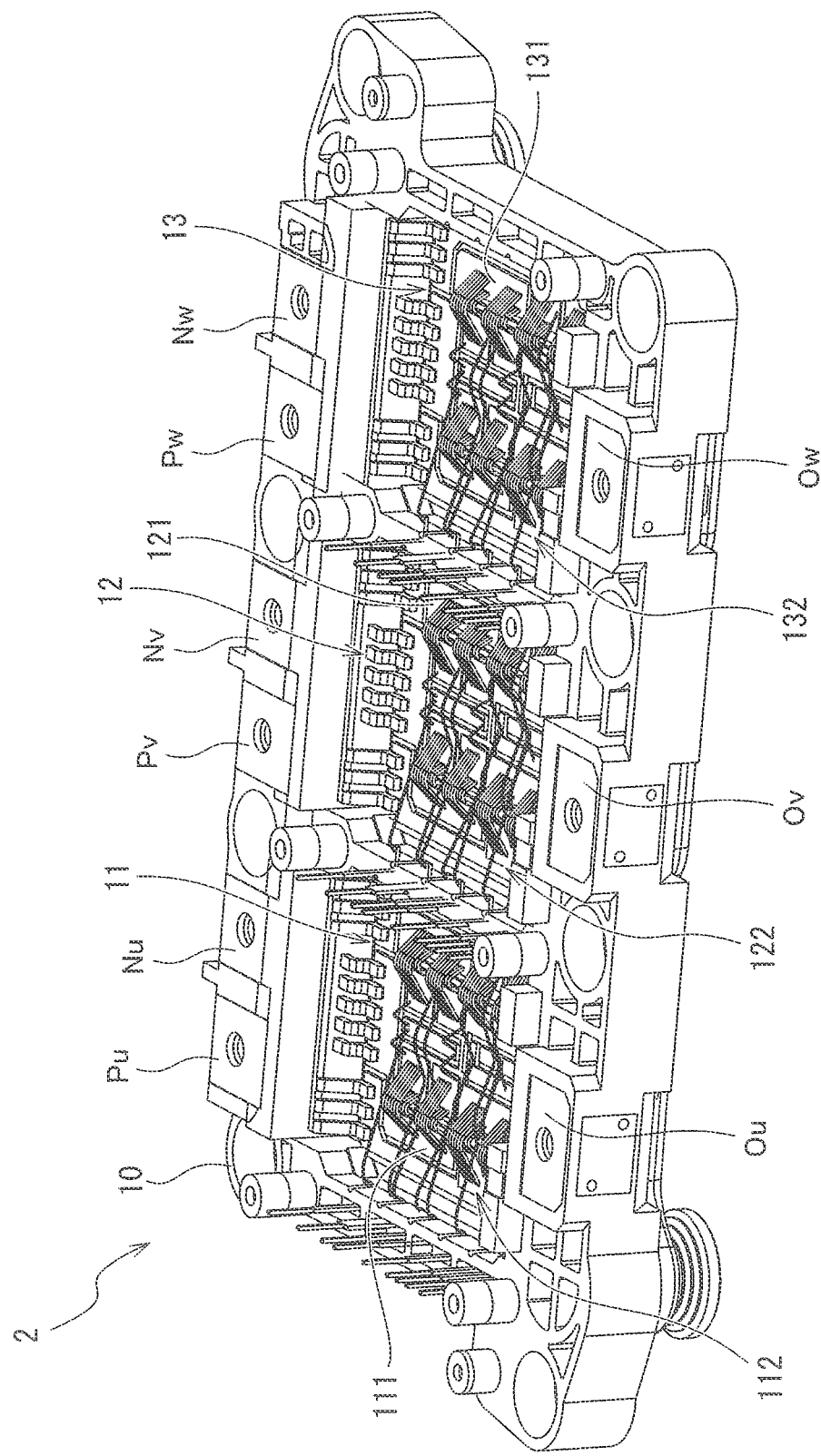
FIG. 11 is a diagram illustrating a schematic configuration of a main part of a semiconductor module according to a second embodiment of the present invention.

As illustrated in FIG. 11, a semiconductor module 2 according to the present embodiment includes the case 10 having a rectangular shape in planar view. The case 10 has the storage section 11 for storing the U-phase inverter portion, the storage section 12 for storing the V-phase inverter portion, and the storage section 13 for storing the W-phase inverter portion. The semiconductor module 2 has the U-phase laminated substrate 111 (an example of the substrate) stored in the storage section 11 and the U-phase inverter circuit 112 mounted on the laminated substrate 111. The semiconductor module 2 has the V-phase laminated substrate 121 (an example of the substrate) stored in the storage section 12 and the V-phase inverter circuit 122 mounted on the laminated substrate 121. The semiconductor module 2 has the W-phase laminated substrate 131 (an example of the substrate) stored in the storage section 13 and the W-phase inverter circuit 132 mounted on the laminated substrate 131.

The semiconductor module 2 includes the U-phase negative terminal Nu (an example of the first power supply terminal) connected to the negative polarity (an example of the first polarity) side of DC power and the positive terminal Pu (an example of the second power supply terminal) connected to the positive polarity (an example of the second polarity) side of the DC power. The negative terminal Nu and the positive terminal Pu are provided on one of both sides of the storage section 11, at one longitudinal end portion of the case 10. The semiconductor module 2 also includes the output terminal Ou for outputting U-phase AC power. The output terminal Ou is provided on the other one of both sides of the storage section 11, at the other longitudinal end portion of the case 10. The positive terminal Pu and the negative terminal Nu are arranged to face the output terminal Ou across the storage section 11.

The semiconductor module 2 includes the V-phase negative terminal Nv (an example of the first power supply terminal) connected to the negative polarity (an example of the first polarity) side of DC power and the positive terminal Pv (an example of the second power supply terminal) connected to the positive polarity (an example of the second polarity) side of the DC power. The negative terminal Nv and the positive terminal Pv are provided on one of both sides of the storage section 12, at one longitudinal end portion of the case 10. The semiconductor module 2 also includes the output terminal Ov for outputting V-phase AC power. The output terminal Ov is provided on the other one of both sides of the storage section 12, at the other longitudinal end portion of the case 10. The positive terminal Pv and the negative terminal Nv are arranged to face the output terminal Ov across the storage section 12.

The semiconductor module 2 includes the W-phase negative terminal Nw (an example of the first power supply terminal) connected to the negative polarity (an example of the first polarity) side of DC power and the positive terminal Pw (an example of the second power supply terminal) connected to the positive polarity (an example of the second polarity) side of the DC power. The negative terminal Nw and the positive terminal Pw are provided on one of both sides of the storage section 13, at one longitudinal end portion of the case 10. The semiconductor module 2 also includes the output terminal Ow for outputting W-phase AC power. The output terminal Ow is provided on the other one of both sides of the storage section 13, at the other longitudinal end portion of the case 10. The positive terminal Pw and the negative terminal Nw are arranged to face the output terminal Ow across the storage section 13.

Thus, in the semiconductor module 2 according the present embodiment, the positive terminal Pu and the negative terminal Nu, the positive terminal Pv and the negative terminal Nv, and the positive terminal Pw and the negative terminal Nw are arranged side by side at the one end portion of the case 10, as in the semiconductor module 1 according to the first embodiment.

The U-phase inverter circuit112, the V-phase inverter circuit122, and the W-phase inverter circuit 132 included in the semiconductor module 2 according to the present embodiment have the same configuration as that of the inverter circuits 112, 122, and 132 included in the semiconductor module 1 according to the first embodiment, so that the description thereof will be omitted.

(Configurations of First Power Supply Terminal and Second Power Supply Terminal)

Next, configurations of the negative terminals Nu, Nv, and Nw (an example of the first power supply terminal) and the positive terminals Pu, Pv, and Pw (an example of the second power supply terminal) included in the semiconductor module 2 according to the present embodiment will be described using FIG. 12. The negative terminals Nu, Nv, and Nw have the same configuration. Therefore, the negative terminal Nu will be exemplified to describe the configuration of the negative terminals Nu, Nv, and Nw. Additionally, the positive terminals Pu, Pv, and Pw have the same configuration. Therefore, the positive terminal Pu will be exemplified to describe the configuration of the positive terminals Pu, Pv, and Pw.

Figure 12:
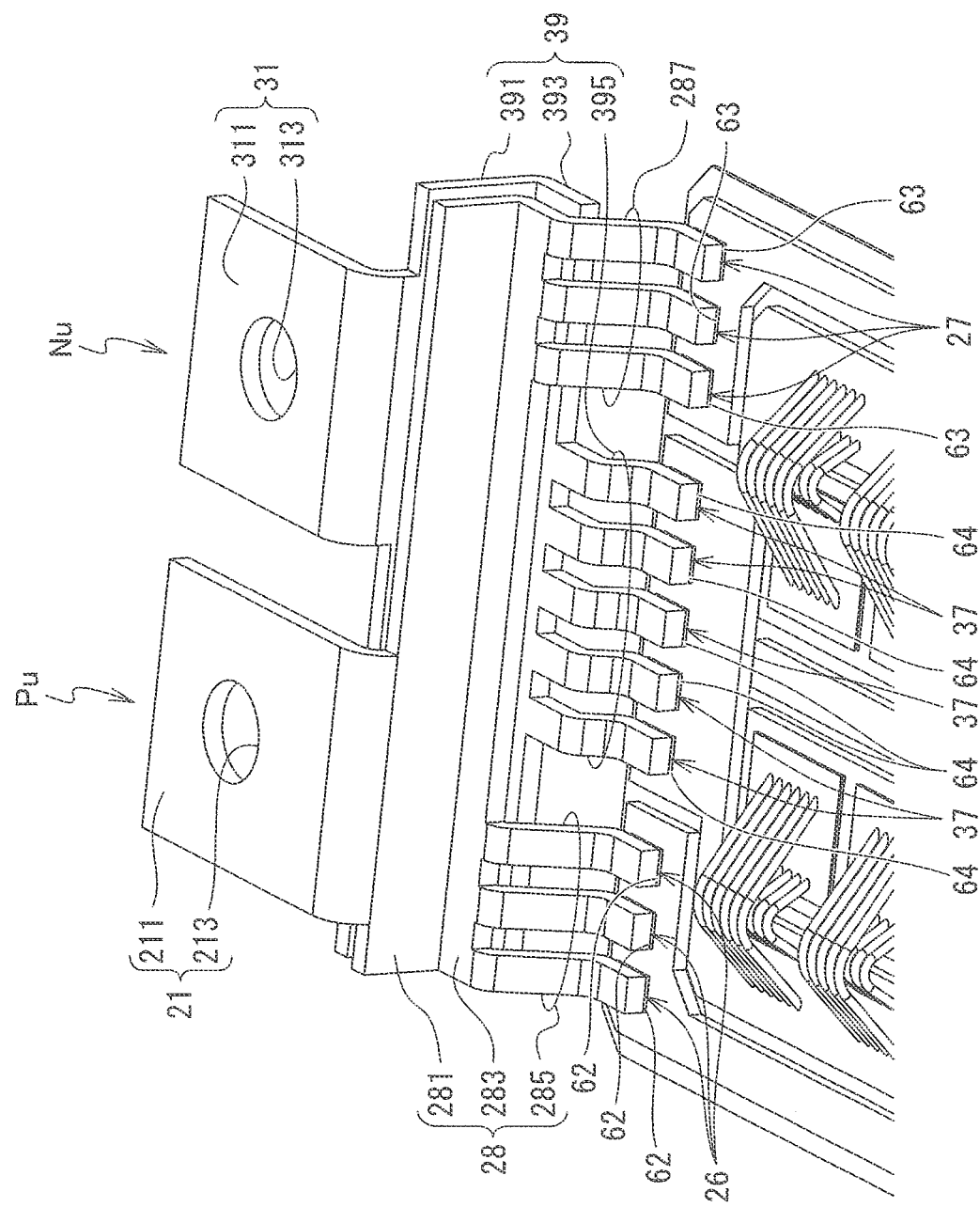
FIG. 12 is a perspective diagram illustrating an example of power supply terminals included in the semiconductor module according to the second embodiment of the present invention.

As illustrated in FIG. 12, the negative terminal Nu has the negative fastening portion (an example of the first fastening portion) 31 for fastening an external terminal (unillustrated) of the negative polarity side, a negative connection portion (an example of the first connection portion) 37 connected to the laminated substrate 111, and a negative intermediate portion (an example of the first intermediate portion) 39 arranged between the negative fastening portion 31 and the negative connection portion 37. The positive terminal Pu has the positive fastening portion (an example of the second fastening portion) 21, which is arranged adjacent to the negative fastening portion 31 and which is for fastening an external terminal (unillustrated) of the positive polarity side, a pair of positive connection portions (an example of the second connection portion) 26 and 27 arranged across the negative connection portion 37 and connected to the laminated substrate 111, and a positive intermediate portion (an example of the second intermediate portion) 28 at least a part of which faces the negative intermediate portion 39 with a predetermined gap and which is arranged between the positive fastening portion 21 and the pair of positive connection portions 26 and 27.

As illustrated in FIG. 12, the negative intermediate portion 39 has a negative facing portion (an example of the first facing portion) 393 arranged to face the plane including the contact surface 111*a*. The negative intermediate portion 39 also has a negative outer extension portion (an example of the first outer extension portion) 391 arranged between the negative facing portion 393 and the negative fastening portion 31 and extending in the direction intersecting with the contact surface 111*a*. The negative intermediate portion 39 further has a negative inner extension portion (an example of the first inner extension portion) 395 arranged between the negative facing portion 393 and the negative connection portion 37 and extending in the direction intersecting with the contact surface 111*a*.

The negative inner extension portion 395 included in the present embodiment is split at an end portion thereof on the laminated substrate 111 side. Specifically, the negative inner extension portion 395 has a shape in which the end portion thereof on the laminated substrate 111 side is branched into multiple portions. The negative connection portion 37 is provided on end faces of the negative inner extension portion 395 on the laminated substrate 111 side. Accordingly, the negative connection portion 37 included in the present embodiment is provided in plural. As a result, the negative terminal Nu contacts, at a plurality of points, with the negative-side input terminal pattern 43 provided on the laminated substrate 111 and is electrically connected thereto.

As illustrated in FIG. 12, the positive intermediate portion 28 has a positive facing portion (an example of the second facing portion) 283 arranged to face the plane including the contact surface 111*a*. The positive intermediate portion 28 also has a positive outer extension portion (an example of the second outer extension portion) 281 arranged between the positive facing portion 283 and the positive fastening portion 21 and extending in the direction intersecting with the contact surface 111*a*. The positive intermediate portion 28 further has a pair of positive inner extension portions (an example of the second inner extension portion) 285 and 287 arranged between the positive facing portion 283 and the pair of positive connection portions 26 and 27 and extending in the direction intersecting with the contact surface 111*a*.

Each of the pair of positive inner extension portions 285 and 287 in the present embodiment is split at an end portion thereof on the laminated substrate 111 side. Specifically, each of the pair of positive inner extension portions 285 and 287 has a shape in which the end portion thereof on the laminated substrate 111 side is branched into multiple portions. The positive connection portion 26 is provided on end faces of the positive inner extension portion 285 on the laminated substrate 111 side. The positive connection portion 27 is provided on end faces of the positive inner extension portion 287 on the laminated substrate 111 side. Accordingly, each of the positive connection portions 26 and 27 in the present embodiment is provided in plural. As a result, the positive terminal Pu contacts, at a plurality of points, with each of the first positive-side input terminal pattern 41 and the second positive-side input terminal pattern 42 provided on the laminated substrate 111 and is electrically connected to each thereof.

Although illustration is omitted, the positive connection portions 26 and 27 and the negative connection portions 37 have one or more convex portions protruding toward the laminated substrate 111. The one or more convex portions provided on the positive connection portions 26 have a height that can ensure the thickness of the solder 62, the one or more convex portions provided on the positive connection portions 27 have a height that can ensure the thickness of the solder 63, and the one or more convex portions provided on the negative connection portions 37 have a height that can ensure the thickness of the solder 64. As a result, the semiconductor module 2 can achieve improved stability in the positive terminal Pu and the negative terminal Nu mounted to the laminated substrate 111.

The negative fastening portion 31, the negative intermediate portion 39, and the negative connection portions 37 are integrally formed, and the positive fastening portion 21, the positive intermediate portion 28, and the positive connection portions 26 and 27 are integrally formed. In the present embodiment, after attaching the positive terminal Pu and the negative terminal Nu, the positive terminal Pv and the negative terminal Nv, and the positive terminal Pw and the negative terminal Nw to the case 10, the positive connection portions 26 and 27 and the negative connection portions 37 of each pair of the positive terminal Pu and negative terminal Nu, the positive and negative terminals Pv and Nv, and the positive terminal Pw and negative terminal Nw are connected to predetermined points on the laminated substrates 111, 121, and 131 by, for example, ultrasonic bonding.

The positive outer extension portion 281 of the positive terminal Pu and the negative outer extension portion 391 of the negative terminal Nu in the present embodiment are stacked and arranged in close proximity to each other, as in the above first embodiment. In addition, the positive facing portion 283 of the positive terminal Pu and the negative facing portion 393 of the negative terminal Nu in the present embodiment are stacked and arranged in close proximity to each other, as in the above first embodiment. This allows changes in the current amount of current flowing through the positive terminal Pu and changes in the current amount of current flowing through the negative terminal Nu to have influence on each other.

Similarly, the positive outer extension portion 281 of the positive terminal Pv and the negative outer extension portion 391 of the negative terminal Nv in the present embodiment are stacked and arranged in close proximity to each other, as in the above first embodiment. In addition, the positive facing portion 283 of the positive terminal Pv and the negative facing portion 393 of the negative terminal Nv in the present embodiment are stacked and arranged in close proximity to each other, as in the above first embodiment. This allows changes in the current amount of current flowing through the positive terminal Pv and changes in the current amount of current flowing through the negative terminal Nv to have influence on each other.

Similarly, the positive outer extension portion 281 of the positive terminal Pw and the negative outer extension portion 391 of the negative terminal Nw in the present embodiment are stacked and arranged in close proximity to each other, as in the above first embodiment. In addition, the positive facing portion 283 of the positive terminal Pw and the negative facing portion 393 of the negative terminal Nw in the present embodiment are stacked and arranged in close proximity to each other, as in the above first embodiment. This allows changes in the current amount of current flowing through the positive terminal Pw and changes in the current amount of current flowing through the negative terminal Nw to have influence on each other.

Thus, the positive terminal Pu and the negative terminal Nu included in the semiconductor module 2 according to the present embodiment are configured so that the parasitic mutual inductance Ms increases according to the shape of the positive terminal Pu itself, the shape of the negative terminal Nu itself, and a relative arrangement relationship between the positive terminal Pu and the negative terminal Nu compared to conventional terminal structures. Similarly, the positive terminal Pv and the negative terminal Nv included in the semiconductor module 2 are configured so that the parasitic mutual inductance Ms increases according to the shape of the positive terminal Pv itself, the shape of the negative terminal Nv itself, and a relative arrangement relationship between the positive terminal Pv and the negative terminal Nv compared to the conventional terminal structures. Similarly, the positive terminal Pw and the negative terminal Nw included in the semiconductor module 2 are configured so that the parasitic mutual inductance Ms increases according to the shape of the positive terminal Pw itself, the shape of the negative terminal Nw itself, and a relative arrangement relationship between the positive terminal Pw and the negative terminal Nw compared to the conventional terminal structures.

Therefore, the semiconductor module 2 achieves increased parasitic mutual inductance Ms in the positive terminal Pu and negative terminal Nu, the positive terminal Pv and negative terminal Nv, and the positive terminal Pw and negative terminal Nw, respectively. As a result, the semiconductor module 2 can reduce the loop inductance Lall of each of the inverter circuits 112, 122, and 132, so that the surge voltage ΔVs generated when switching the semiconductor elements can be reduced.

In addition, the parasitic capacitance Cs is formed between the positive terminal Pu and the negative terminal Nu, between the positive terminal Pv and the negative terminal Nv, and between the positive terminal Pw and the negative terminal Nw in the present embodiment by the same effects as those of the positive terminal Pu and negative terminal Nu, the positive terminal Pv and negative terminal Nv, and the positive terminal Pw and negative terminal Nw in the above first embodiment. This allows the semiconductor module 2 to further increase the parasitic mutual inductance Ms in the positive terminal Pu and negative terminal Nu, the positive terminal Pv and negative terminal Nv, and the positive terminal Pw and negative terminal Nw, respectively. As a result, the semiconductor module 2 can further reduce the surge voltage ΔVs generated when switching the semiconductor elements.

As described above, the semiconductor module 2 according to the present embodiment can achieve miniaturization and reduced manufacturing cost while suppressing surge voltage generated when switching the semiconductor elements.

The present invention is not limited to the above embodiments and can be variously modified While in the above first and second embodiments, the transistors included in the semiconductor elements are wide-bandgap semiconductor elements, the transistors may be IGBTs.

In the above first and second embodiments, the resin layer 61 is provided at least a part between the positive terminal Pu and the negative terminal Nu, between the positive terminal Pv and the negative terminal Nv, and between the positive terminal Pw and the negative terminal Nw. However, insulating paper may be provided. In this case, the gap is small between the positive intermediate portion and the negative intermediate portion in the positive terminal Pu and negative terminal Nu, the positive terminal Pv and negative terminal Nv, and the positive terminal Pw and negative terminal Nw, respectively. This increases the capacitance value of the parasitic capacitance Cs formed between the positive terminal Pu and the negative terminal Nu, between the positive terminal Pv and the negative terminal Nv, and between the positive terminal Pw and the negative terminal Nw, respectively. As a result, the semiconductor modules 1 and 2 can further reduce surge voltage generated when switching the semiconductor elements.

In the above first and second embodiments, the positive facing portion 253 and the pair of positive inner extension portions 255 and 257 are bonded to each other by, for example, seam welding, and the negative facing portion 353 and the negative inner extension portion 355 are bonded to each other by, for example, seam welding. However, the present invention is not limited thereto. The positive facing portion 253 and the pair of positive inner extension portions 255 and 257 may be bonded to each other by, for example, spot welding using laser welding, and the negative facing portion 353 and the negative inner extension portion 355 may be bonded to each other by, for example, spot welding using laser welding. In this case, the positive facing portion 253 and the pair of positive inner extension portions 255 and 257, and the negative facing portion 353 and the negative inner extension portion 355, respectively, are laser welded with, for example, 1.2 mm spots, at a plurality of points, and at equal intervals where adjacent spots do not overlap each other.

The resin layer in the above first and second embodiments is made of PPS, but the present invention is not limited thereto. The resin layer may be made of a material having a relative permittivity of 3 or more or a material having a relative permittivity ranging from 3 to 5. When the relative permittivity εs of the material forming the resin layer is 3 or more, the parasitic capacitance increases, so that surge voltage reduction can be improved.

The technological scope of the present invention is not limited to the illustrated and described exemplary embodiments, and includes all embodiments that provide equivalent advantageous effects to those intended by the invention. Furthermore, the technological scope of the invention is not limited to combinations of the features of the invention defined by the claims, and may be defined by any desired combination of specific features among all disclosed respective features.

REFERENCE SIGNS LIST 1, 2: Semiconductor module
10: Case
11, 12, 13: Storage section
21: Positive fastening portion
22, 23, 26, 27: Positive connection portion
25, 28: Positive intermediate portion
31: Negative fastening portion
33, 37: Negative connection portion
35, 39: Negative intermediate portion
40: Insulating substrate
41: First positive-side input terminal pattern
42: Second positive-side input terminal pattern
43: Negative-side input terminal pattern
44: First positive portion pattern
45: Second positive portion pattern
46: Negative portion pattern
47: Output portion pattern
49: Output terminal pattern
51, 52, 53, 54, 55, 56, 57, 58: Connection member
60: Heat dissipation pattern layer
61: Resin layer
62, 63, 64: Solder
65a, 65b, 65c: Bonded portion
111, 121, 131: Laminated substrate
111a: Contact surface
112, 122, 132: Inverter circuit
211, 311: Arrangement portion
213, 313: Through hole
221, 231, 331: Convex portion
251, 281: Positive outer extension portion
253, 283: Positive facing portion
255, 257, 285, 287: Positive inner extension portion
351, 391: Negative outer extension portion
353, 393: Negative facing portion
355, 395: Negative inner extension portion
611: First portion
612: Second portion
613: Third portion
614: Fourth portion
Cs: Parasitic capacitance
Dlo11, Dlo12, Dlo21, Dlo22, Dup11, Dup12, Dup21, Dup22: Freewheeling diode
Glo11, Glo12, Glo21, Glo22, Gup11, Gup12, Gup21, Gup22: Gate signal input terminal
Is: Surge current
Lall: Loop inductance
Ls: Synthetic parasitic inductance
Ls1, Ls2, Ls3, Ls4, Ls5, Lsn, Lsp: Parasitic inductance
Ms: Parasitic mutual inductance
Nu, Nv, Nw: Negative terminal
Ou, Ov, Ow: Output terminal
Pu, Pv, Pw: Positive terminal
Qlo11, Qlo12, Qlo21, Qlo22, Qup11, Qup12, Qup21, Qup22: Transistor
Rlo11, Rlo12, Rlo21, Rlo22, Rup11, Rup12, Rup21, Rup22: Reference signal input terminal
Slo11, Slo12, Slo21, Slo22, Sup11, Sup12, Sup21, Sup22: Semiconductor element
Ulo, Vlo, Wlo: Lower arm
Uup, Vup, Wup: Upper arm
ΔVs: Surge voltage

The invention claimed is:

1. A semiconductor module comprising:
a first power supply terminal connected to a first polarity side of DC power;
a second power supply terminal connected to a second polarity side of the DC power;
a plurality of semiconductor elements connected in series between the first power supply terminal and the second power supply terminal; and
a substrate including the plurality of semiconductor elements,
wherein the first power supply terminal has a first fastening portion for fastening an external terminal of the first polarity side, a first intermediate portion connected to the first fastening portion, a first connection portion connected to the first intermediate portion, and a first inner extension portion connected between the substrate and the first connection portion; and
wherein the second power supply terminal has a second fastening portion arranged adjacent to the first fastening portion for fastening an external terminal of the second polarity side, a pair of second connection portions arranged across the first connection portion, a second intermediate portion at least a part of which faces the first intermediate portion with a predetermined gap and which is arranged between the second fastening portion and the pair of second connection portions, and a pair of second inner extension portions arranged to sandwich the first inner extension portion therebetween, each having a length longer than that of the first inner extension portion and being connected between the substrate and the second connection portion.

2. The semiconductor module according to claim 1, wherein the first intermediate portion has a staircase shape;

and wherein the second intermediate portion has a staircase shape following the shape of the first intermediate portion.

3. The semiconductor module according to claim 1, wherein the first fastening portion and the second fastening portion are arranged side by side along an end portion of the substrate.

4. The semiconductor module according to claim 1, wherein each of the first fastening portion and the second fastening portion is arranged outside the end portion of the substrate.

5. The semiconductor module according to claim 1, wherein the first intermediate portion includes a negative outer extension portion, and a negative facing portion bent relative to the negative outer extension portion and having a T-shape, and
the second intermediate portion includes a positive outer extension portion spaced from the negative outer extension portion, and a positive facing portion bent relative to the positive outer extension portion and having a U-shape, the positive facing portion being disposed above the negative facing portion with a space thereto such that the U-shape which is inverted is located above the T-shape.

6. A semiconductor module comprising:
a first power supply terminal connected to a first polarity side of DC power;
a second power supply terminal connected to a second polarity side of the DC power;
a plurality of semiconductor elements connected in series between the first power supply terminal and the second power supply terminal; and
a substrate including the plurality of semiconductor elements,
wherein the first power supply terminal has a first fastening portion for fastening an external terminal of the first polarity side, a first connection portion connected to the substrate, and a first intermediate portion arranged between the first fastening portion and the first connection portion;
wherein the second power supply terminal has a second fastening portion arranged adjacent to the first fastening portion for fastening an external terminal of the second polarity side, a pair of second connection portions arranged across the first connection portion and connected to the substrate, and a second intermediate portion at least a part of which faces the first intermediate portion with a predetermined gap and which is arranged between the second fastening portion and the pair of second connection portions,
wherein the substrate has a contact surface for contacting the first connection portion and the pair of second connection portions;
wherein the first intermediate portion has a first facing portion arranged to face a plane including the contact surface, a first outer extension portion arranged between the first facing portion and the first fastening portion and extending in a direction intersecting with the contact surface, and a first inner extension portion arranged between the first facing portion and the first connection portion and extending in the direction intersecting with the contact surface;
wherein the second intermediate portion has a second facing portion arranged to face the plane including the contact surface, a second outer extension portion arranged between the second facing portion and the second fastening portion and extending in the direction intersecting with the contact surface, and a pair of second inner extension portions arranged between the second facing portion and the pair of second connection portions and extending in the direction intersecting with the contact surface;
wherein the first facing portion and the second facing portion are arranged to face each other with the predetermined gap; and
wherein the first outer extension portion and the second outer extension portion are arranged to face each other with the predetermined gap.

7. The semiconductor module according to claim 6, wherein the first outer extension portion and the first facing portion are formed by bending a single plate-like member, and, together the first inner extension portion, form the staircase shape; and wherein the second outer extension portion and the second facing portion are formed by bending a single plate-like member, and, together with the pair of second inner extension portions, form the staircase shape.

8. The semiconductor module according to claim 7, wherein the second facing portion is arranged to cover the first facing portion while exposing a part of the first facing portion between the pair of second inner extension portions; wherein the part of the first facing portion is bonded to the first inner extension portion formed into a prismatic shape; and wherein parts of the second facing portion located on both sides of the part are bonded to the pair of second inner extension portions each formed into a prismatic shape.

9. The semiconductor module according to claim 7, wherein the first fastening portion, the first outer extension portion, and the first facing portion are integrally formed; and wherein the second fastening portion, the second outer extension portion, and the second facing portion are integrally formed.

10. The semiconductor module according to claim 6, wherein the second facing portion is arranged to cover the first facing portion while exposing a part of the first facing portion between the pair of second inner extension portions; wherein the part of the first facing portion is bonded to the first inner extension portion formed into a prismatic shape; and wherein parts of the second facing portion located on both sides of the part are bonded to the pair of second inner extension portions each formed into a prismatic shape.

11. The semiconductor module according to claim 10, wherein the part of the first facing portion and the first inner extension portion are bonded to each other by laser welding, and the parts of the second facing portion and the pair of second inner extension portions are bonded to each other by laser welding.

12. The semiconductor module according to claim 6, wherein the first fastening portion, the first outer extension portion, and the first facing portion are integrally formed; and wherein the second fastening portion, the second outer extension portion, and the second facing portion are integrally formed.

13. The semiconductor module according to claim 6, wherein the first fastening portion, the first intermediate portion, and the first connection portion are integrally formed; and wherein the second fastening portion, the second intermediate portion, and the pair of second connection portions are integrally formed.

14. The semiconductor module according to claim 13, wherein each of the first inner extension portion and the pair of second inner extension portions is split at an end portion on the substrate side.

15. The semiconductor module according to claim 1, wherein the first connection portion has one or more first convex portions protruding toward the substrate; and wherein the second connection portion has one or more second convex portions protruding toward the substrate.

16. The semiconductor module according to claim 6, comprising a resin layer provided at least in the predetermined gap between the first outer extension portion and the second outer extension portion and in the predetermined gap between the first facing portion and the second facing portion.

17. The semiconductor module according to claim 16, wherein the resin layer is formed in a region of the first facing portion that is not facing the second facing portion.

18. The semiconductor module according to claim 16, wherein the resin layer is formed to cover at least one of a side end portion of the first outer extension portion on a side including the first fastening portion and a side end portion of the second outer extension portion on a side including the second fastening portion.

19. The semiconductor module according to claim 16, wherein the resin layer is formed to cover a backside of a facing surface of the first outer extension portion facing the second outer extension portion.

20. The semiconductor module according to claim 16, wherein the resin layer is made of a material having a relative permittivity of from 3 to 5.

* * * * *